US011262256B2

(12) United States Patent
Molinazzi et al.

(10) Patent No.: US 11,262,256 B2
(45) Date of Patent: Mar. 1, 2022

(54) SENSOR ELEMENTS ON THIN FOIL/FILMS

(71) Applicant: EZMEMS LTD., Kfar Saba (IL)

(72) Inventors: Nicola Molinazzi, Kfar Sava (IL); Tsvi Shmilovich, Pardes Hanna-Karkur (IL)

(73) Assignee: EZMEMS LTD., Kfar Saba (IL)

( * ) Notice: Subject to any disclaimer, the term of this patent is extended or adjusted under 35 U.S.C. 154(b) by 0 days.

(21) Appl. No.: 16/624,476

(22) PCT Filed: Jun. 21, 2018

(86) PCT No.: PCT/IL2018/050690
§ 371 (c)(1),
(2) Date: Dec. 19, 2019

(87) PCT Pub. No.: WO2018/235087
PCT Pub. Date: Dec. 27, 2018

(65) Prior Publication Data
US 2020/0116578 A1    Apr. 16, 2020

Related U.S. Application Data

(60) Provisional application No. 62/523,315, filed on Jun. 22, 2017.

(51) Int. Cl.
| | | |
|---|---|---|
| *G01L 1/22* | (2006.01) | |
| *G01L 1/18* | (2006.01) | |
| *G01L 9/06* | (2006.01) | |
| *H01C 17/06* | (2006.01) | |
| *H01C 17/24* | (2006.01) | |

(52) U.S. Cl.
CPC .............. *G01L 1/2287* (2013.01); *G01L 1/18* (2013.01); *G01L 9/06* (2013.01); *H01C 17/06* (2013.01); *H01C 17/24* (2013.01)

(58) Field of Classification Search
CPC ....... H01C 17/06; H01C 17/24; G01L 1/2287; G01L 1/18; G01L 9/06
See application file for complete search history.

(56) References Cited

U.S. PATENT DOCUMENTS

| | | |
|---|---|---|
| 2,885,524 A | 5/1959 | Paul |
| 3,439,761 A | 4/1969 | Laimins |
| 4,311,980 A | 1/1982 | Prudenziati |

(Continued)

FOREIGN PATENT DOCUMENTS

| | | |
|---|---|---|
| CN | 101271029 A | 9/2008 |
| DE | 4015666 A1 | 11/1991 |

(Continued)

OTHER PUBLICATIONS

WO2017026610, Kim et al., (machine translation). (Year: 2017).*
International Search Report from International Application No. PCT/IL2018/050690 dated Sep. 6, 2018.

*Primary Examiner* — Kyung S Lee
(74) *Attorney, Agent, or Firm* — Dorsey & Whitney, LLP

(57) ABSTRACT

A sensor device is disclosed comprising at least one deformable substrate, at least one transducer element formed in or on a surface area of a first side of the deformable substrate, at least one other transducer element formed in or on a surface area of a second side of the deformable substrate, and electrical conductors formed on and/or in the substrate for electrically connecting between and to the transducer elements.

20 Claims, 14 Drawing Sheets

(56) References Cited

U.S. PATENT DOCUMENTS

| | | | |
|---|---|---|---|
| 4,420,985 A | 12/1983 | Raskin | |
| 5,092,177 A | 3/1992 | Varacca | |
| 5,328,551 A | 7/1994 | Kovacich | |
| 6,948,377 B2* | 9/2005 | Wingett | G01L 5/0047 |
| | | | 73/795 |
| 2006/0189201 A1 | 8/2006 | Kieffer et al. | |
| 2009/0001974 A1* | 1/2009 | Sheiretov | G01L 3/105 |
| | | | 324/209 |
| 2011/0053737 A1* | 3/2011 | Chang | G01L 9/0052 |
| | | | 482/83 |
| 2012/0042715 A1 | 2/2012 | Liu | |
| 2016/0147353 A1 | 5/2016 | Filiz et al. | |
| 2016/0341759 A1* | 11/2016 | Yamaji | G01L 9/0054 |
| 2018/0326456 A1* | 11/2018 | Park | G06F 3/0412 |

FOREIGN PATENT DOCUMENTS

| | | |
|---|---|---|
| DE | 19936856 C1 | 9/2000 |
| EP | 0321097 A2 | 6/1989 |
| EP | 3333558 A1 | 6/2018 |
| RU | 146089 U1 | 9/2014 |
| WO | 9515483 A1 | 6/1995 |
| WO | 2017026610 A1 | 2/2017 |

\* cited by examiner

Cuts to increase the path length

A-A

B-B

C-C

D-D

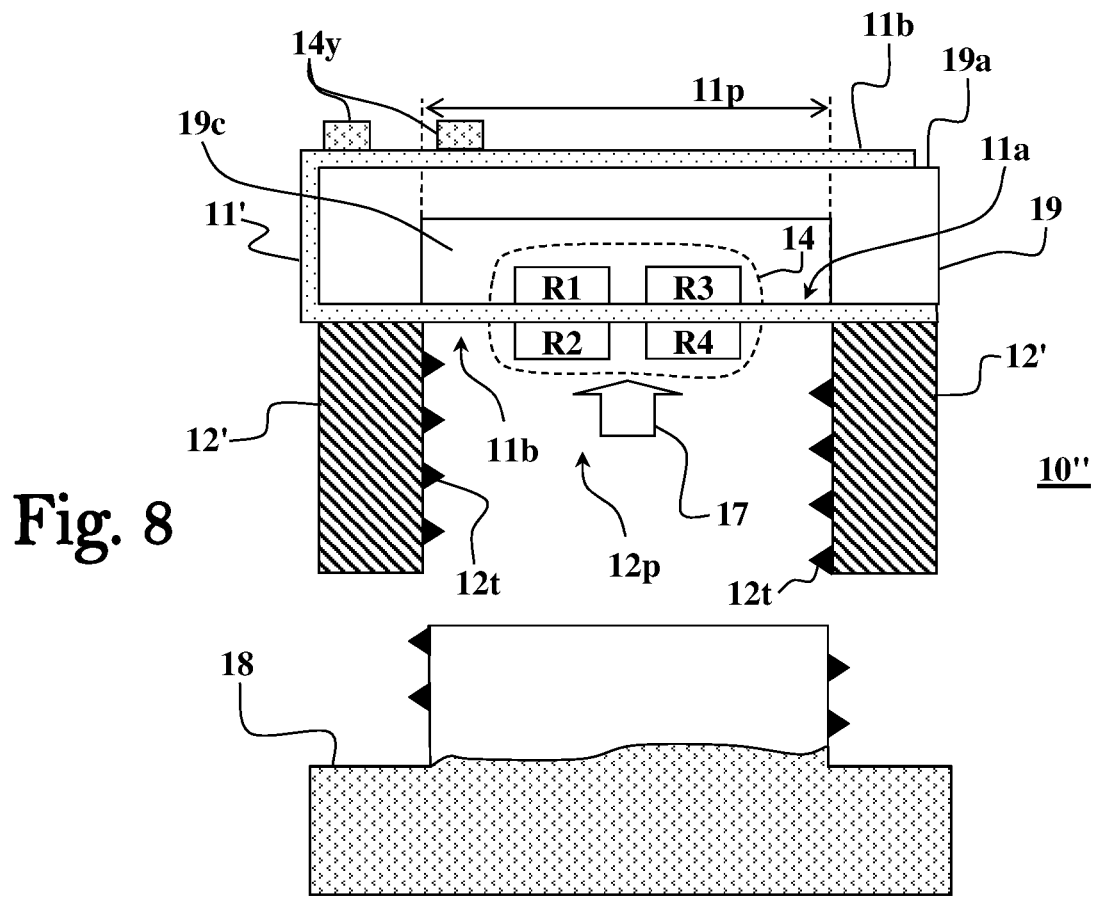
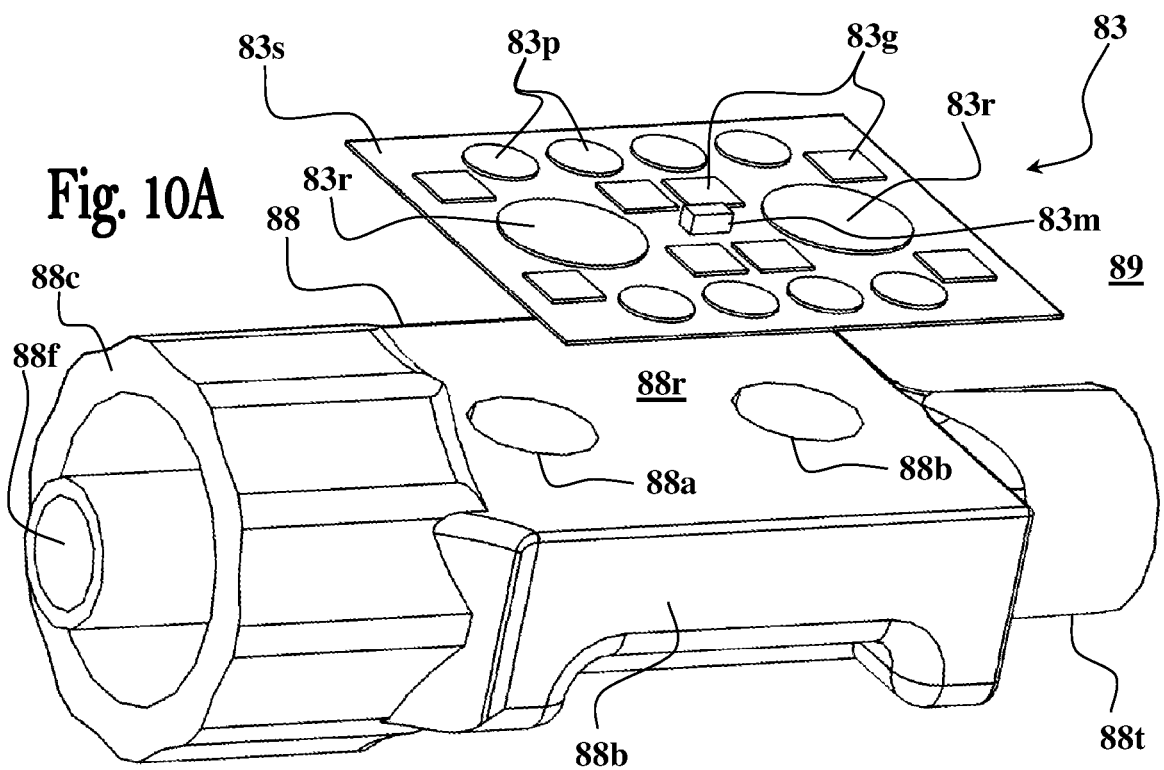

SENSOR ELEMENTS ON THIN FOIL/FILMS

TECHNOLOGICAL FIELD

The present invention is generally in the field of sensor devices, and in particular relates to the fabrication of micromechanical sensors.

BACKGROUND

Strain gauge sensors typically includes a metallic foil pattern formed on a deformable electrically insulating substrate designed to be attached to an object for measuring its tension. After attaching the strain gauge sensor to the object its metallic foil is deformed in response to deformations of the objet to which it is attached, thereby causing a respective change in its electrical resistance, which is indicative of the object's strain according to a gauge factor of the sensor.

The electrical resistance change of the strain gauge sensor is typically measured using three external resistors that are electrically connected to the strain gauge sensor in a form of a Wheatstone bridge calibrated to be in equilibrium in strain-free/relaxed states of the object. These conventional strain gauge designs however do not fully exploit the surface area of the deformable substrate of the sensor, do not allow to build a full Wheatstone bridge configuration on a single foil that can be directly and readily attached for measurement on the object which strain is to be measured, and they are difficult to miniaturize for small/miniature implementations, such as required in micromechanical systems (MEMs). In addition, the conventional strain gauge designs are especially difficult and not suitable for implementation on plastic materials due to the poor thermal power dissipation capacity of the plastic substrate to which they are applied.

Some strain gauge configurations know from patent literature are briefly described hereinbelow.

DE19936856 describes a method of manufacturing a strain-gauge foil element containing a carrier foil and a metallic layer applied onto this and forming electrical terminals and a conductor path joining the terminals. The metallic layer is applied on to the carrier foil by means of depositing discrete metal particles on to the carrier foil which join together to form the metal layer. Specifically, the metal particles are sputtered on to the carrier foil, and more specifically in addition to the metallic layer a further metal layer of another material is sputtered on to the carrier foil.

In US 2012/042715 multiple flow sensors in an array are provided to achieve wide dynamic range, low detection limit, and potentially low cost. Each flow sensor can measure the flow rate of surrounding fluid, among other fluid parameters. The flow sensor can be rendered active by inclusion of a piezoelectric element so as to be capable of achieving mechanical vibration, hence allowing it to interact with local fluid surroundings, or capable of converting mechanical energy in the surrounding fluid to electrical signals and energy.

RU146089U describes a semiconductor strain gage, containing formed on the polymer substrate carrier metal foil in the form of two sites and threads, the ends of which are in the form elements connected by a bridge with the sides of each of the sites, and made on the carrier layers repeat it forms a dielectric film, Gage film polycrystalline samarium monosulfide and strain-gauge film formed on the metal film, performing the role of the contact pads and also repeats the shape of the support, but with a gap in the middle of the thread.

GENERAL DESCRIPTION

There is a need in the art for miniaturized strain gauge sensors that can be manufactured to include all sensor elements needed for sensor calibration and for conducting measurements therewith on a single substrate. The present application provides configurations and fabrication techniques of small size strain gauge sensors having electrical measurement and calibration/trimming elements formed over at least first and second sides of a deformable substrate for maximal exploitation of surface areas of the substrate and optimal sensor miniaturization. The strain gauge sensors disclosed herein can be thus manufactured as very small size sensors (e.g., 50×50 to 0.05×0.05 mm) provided readily operable for attachment to an object for measuring strains thereof with all elements needed to calibrate/trim the sensors right after their attachment to the objects and taking measurements immediately and directly thereafter.

Embodiments of the strain gauge sensors of the present application are designed for mass production as an array/matrix of sensor elements arranged in row and columns on a deformable substrate. One or more strain gauge sensors can be easily cut/diced from the array/matrix of sensor elements, each being readily operable for attachment to an object, for calibration/trimming after attachment to the object, and measuring strains of the object immediately thereafter. In this way a stain gauge of the present application can be advantageously calibrated after it is attached to the object which strains are to be measured, thereby compensating all the stresses/deformations caused/induced due the attachment process of the strain gauge sensor to the object.

Optionally, and in some embodiments preferably, the array/matrix of sensor elements is configured for attachment to a respective array of MEMS/plastic bodies arranged in a wafer for measurement of properties and/or conditions of a fluid introduced into lumens and/or cavities of the MEMS/plastic bodies. This can be achieved in some embodiments by attaching the array/matrix of sensor elements such that each sensor element is attached to elastically deformable parts of its respective MEMS body/plastic body in the wafer, or sealably cover and close an opening of a cavity/lumen or a fluid passage thereof. The sensor elements can be calibrated before dicing the MEMS from the wafer.

In some embodiments the sensor elements are formed over the two sides of a thin substrate (e.g., having thickness of about 10 to 1000 micrometer), such as a film or foil made of polyimide, PEEK, Ultem, PEI, polycarbonate, PMMA, Teflon, PET, PEN or any other polymeric foil. It is however noted that the arrangement of the sensor elements on the two sides of the substrate is not necessarily symmetrical e.g., conductivity and/or humidity sensors can be implemented on one side of substrate and/or one side can be used for measuring or as a reference. Optionally, and in some embodiments preferably, at least one resistive element of each strain gauge sensor is formed on a first side of the substrate, at least one other resistive element of the strain gauge sensor is formed on a second side of the substrate. At least one calibration/trimming structure and contact pads can be formed on either the first or second side of the substrate, or on both sides thereof. One or more vias (pass through bores filled of covered by an electrically conductive material) are formed in the substrate to electrically connect between the sensor elements formed on its first and second sides.

The term sensor elements as used herein refers to the electrically conducting patterns formed on surface areas of the side faces of the substrate, including the resistive elements and/or the contact pads and/or the calibration/trimming structures.

In some embodiments two resistive elements are formed on the first side of the substrate and two other resistive elements are formed on the second side of the substrate, and resistive elements on the first and second side of the substrate are electrically connected to each other by electrically conducting lines and vias to form a Wheatstone bridge.

One inventive aspect of the subject matter disclosed herein relates to a sensor device comprising at least one deformable substrate, at least one transducer element formed in or on a surface area of a first side of the deformable substrate, at least one other transducer element formed in or on a surface area of a second side of the deformable substrate, and electrical conductors formed on and/or in the substrate for electrically connecting between and to the transducer elements. In some embodiments the transducing elements and their electrical connections are configured on an integrated foil i.e., the transducing elements and the electrical conductors are integral elements of the substrates and formed in it. The device can comprise at least one via hole formed in the substrate for electrically connecting between at least one transducing element and electrical conductor formed on different sides of the substrate.

In some embodiments the substrate is made from two or more electrically conducting layers attached on an electrically non-conducting film. These two or more electrically conducting layers can be configured to form the transducer elements and the electrical conductors. Optionally, but in some embodiments preferably, at least one protective layer is applied over regions of the two or more electrically conducting layers. The protective layer can comprise at least one electrically insulating region covering at least the transducing elements.

The device comprises in some embodiments contact pads formed in the substrate and electrically connected to one or more of the electrical conductors, and the at least one protective layer can comprise at least one electrically conducting region located on top of at least one of the contact pads.

In some possible embodiments the two or more electrically conducting layers comprise a first layer made of a piezoresistive material or compound attached to the film, and a layer made of a material or compound having good electrical conduction properties applied over the first layer. The transducer elements can be made from patterns formed in the first layer in regions thereof wherein the second layer been removed or not applied. With this configuration the electrical conductors can be made from patterns formed in both the first and the second layers.

The device comprises in some embodiments at least one calibration element formed on the first or second side of the substrate and electrically connected to at least one of the transducer elements. The calibration element can be configured for adjusting at least one electrical property associated with the at least one transducer element. In some possible embodiments the at least one calibration element is made from patterns formed in the first layer in regions thereof wherein the second layer been removed or not applied.

In some embodiments the first and second electrically conducting layers are applied over the first and second sides of the film. Optionally, the protective layers applied over the two or more electrically conducting layers formed on the top and bottom sides of the film are made from different materials. In some applications the protective layer applied over the two or more electrically conducting layers formed on the bottom side of the film is a biocompatible, or food grade, layer configured to contact an examined fluid and isolate said fluid from the electrically conducting layers.

The protective layer applied over the two or more electrically conducting layers formed on the bottom side of the film can be also configured to sealingly attach to an object to which said device is to be attached. For example, in some embodiments the protective layer applied over the two or more electrically conducting layers formed on the bottom side of the film is made from a thermoset material configured to be attached to a plastic object by welding (e.g., laser) or overmolding.

The film is optionally made from a polymeric material having a thickness in a range of 10 to 1000 micrometers. Optionally, the first electrically conducting layer is made of NiCr having sheet resistance of about 5 Ohm/sq to 1000 Ohm/sq. The second electrically conducting layer can be made of Copper having thickness of about 1 to 35 micrometers. In some embodiments the protective layer comprises coverlay having thickness of about 5 to 300 micrometers. In a variant, the protective layer comprises gold.

The device comprises in some embodiments adhesive, or adhesive promoter, between the film and the first layer of the substrate. Alternatively or additionally, the device comprises adhesive, or adhesive promoter, between the second layer and at least some portion of the protective layer.

Optionally, and in some embodiment preferably, the transducing elements and their electrical connections are configured to form at least one differential measurement circuitry. The sensor device can comprise at least two transducer elements formed on the first side of the substrate, and at least two transducer elements formed on the second side of the substrate. This configuration is exploited in some embodiments to form at least one Wheatstone bridge, optionally, at least one full Wheatstone bridge.

Another inventive aspect of the subject matter disclosed herein relates to a method of fabricating a sensor device comprising forming/patterning at least one transducer element in or on a first side of a deformable substrate, forming/patterning at least one transducer element in or on a second side of the deformable substrate, and forming at least one electrical conductor in or on the substrate for electrically connecting between the at least one transducer element formed/patterned on the first side of the deformable substrate and the at least one transducer element formed/patterned on the second side of the deformable substrate.

Optionally, and in some embodiments preferably, the forming/patterning of the transducer elements on the first and second sides of the deformable substrate comprises applying over the first and second sides of the deformable substrate a first layer of a material having desired electrical resistance properties, applying on the first layer a second layer of a material having desired electrical conductivity properties, selectively removing portions of the first and second layers on the first and second sides of the deformable substrate to form the transducer elements and the at least one electrically conductor, and selectively removing portions of the second layer residue on surface areas of the first and second sides of the deformable substrate comprising the transducer elements.

Embodiments of the present application can further comprise selectively removing portions of the first and second layers to form at least one trimming grid on at least one of the first and second sides of the deformable substrate, and selectively removing portions of the second layer residue on surface areas of the deformable substrate comprising the at least one trimming grid.

Optionally, the selective removal of portions of the first and second layers comprises a first lithography and etching processes for removing portions of the first and second layers followed by a second lithography and etching processes for removing some portions of the second layer from portions of the first layer not removed by the first lithography and etching processes. Alternatively, the selective removal of portions of the first and second layers comprises a first lithography and etching processes for removing only portions of the second layer followed by a second lithography and etching processes for removing portions of the first layer.

Optionally, and in some embodiments preferably, the electrically connecting between the at least one transducer element formed/patterned on the first side of the deformable substrate and the at least one transducer element formed/patterned on the second side of the deformable substrate comprises drilling and metalizing vias in the deformable substrate after applying the first and second layers.

The method can further comprise selectively applying a protective layer over residues of the first and second layers on the first and second sides of the substrate. The method can further comprise forming at least one contact pad in or on the substrate in electrical connection with at least one of the transducing elements. Optionally, some portion of the protective layer having a defined electrical conductivity properties is applied over surface areas of the at least one contact pads, and some portion of the protective layer having a defined electrical insulating properties is applied over surface areas of the transducing elements and electrical conductors.

Optionally, arrangement of elements on the substrate is asymmetric. In some embodiments elements on one side of the substrate are used to measure certain condition/property different from a condition/property measured by elements on the other side of the substrate. Alternatively or additionally, elements of one side of the substrate are used measurements and elements on the other side of the substrate are used as a reference.

Optionally, the applying the first and second layers is carried out by lamination. In some embodiments the fabrication of the sensor device is carried out in a-roll-to-roll process.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIGS. 1A and 1B schematically illustrate a strain gauge sensor according to some possible embodiments, wherein FIG. 1A is a sectional view showing elements of the sensor and FIG. 1B illustrates an electrical connection of the sensor elements for forming a Wheatstone bridge;

FIG. 2A to FIG. 2D schematically illustrate a possible embodiment of the strain gauge sensor, wherein FIG. 2A shows sensor elements formed on a first side of the substrate of the sensor, FIG. 2B shows sensor elements formed on a second side of the substrate of the sensor, FIG. 2C shows the sensor elements formed on the both sides of the substrate of the sensor, and FIG. 2D demonstrates an alternative implementation of the coarse trimming/calibration elements;

FIG. 5A to 5C schematically illustrate techniques of manufacturing strain gauge sensors according to some possible embodiments, wherein FIGS. 5A and 5B are flowcharts schematically illustrating construction of strain gauge sensors according to some possible embodiments, and FIG. 5C schematically illustrates a possible roll-to roll production process;

FIG. 8 schematically illustrates a strain gauge sensor according to some possible embodiments in which an extension of the substrates is used for mounting additional circuitries and/or contact pads;

FIGS. 10A to 10C schematically illustrate application of a measuring device utilizing the strain gauge sensors according to some possible embodiments, wherein FIG. 10A the strain gauge sensor before it is attached to an object, FIG. 10B shows a sectional view of the object; and FIG. 10C the strain gauge sensor after it is attached to an object; and FIGS. 11A to 11C schematically illustrate an implementation of the strain gauge sensor according to some possible embodiments, wherein FIG. 11A shows a top view of the sensor, FIG. 11B shows a bottom view of the sensor, and FIG. 11C shows an electrical diagram of the sensor.

DETAILED DESCRIPTION OF EMBODIMENTS

Figure 1A:
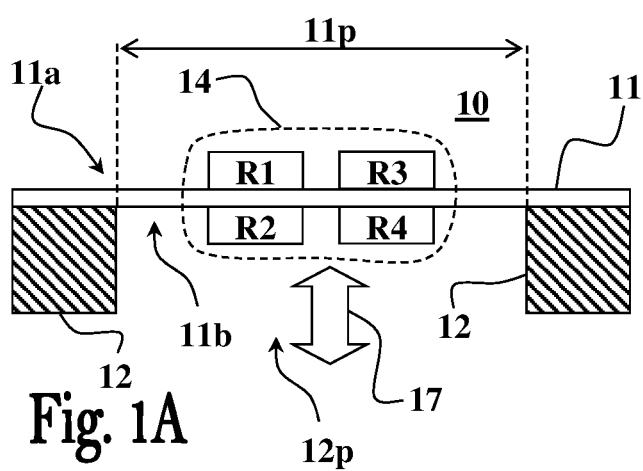

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to make and use it, once they understand the principles of the subject matter disclosed herein. This invention may be provided in other specific forms and embodiments without departing from the essential characteristics described herein.

The present application provides configurations and fabrication techniques of a substantially small size strain gauge sensors, optionally having a differential measurement circuitry (a Wheatstone bridge), and optionally also having calibration/trimming elements thereof, compactly distributed over at least first and seconds sides of an elastically deformable substrate usable for forming a membrane deformable under pressure conditions. It is noted that in possible embodiments the substrate is not required to be deformable i.e., the substrate can be resilient or rigid if there is no need to measure pressures.

FIG. 1A shows a sectional view of a strain measurement setup 10 employing a strain gauge sensor 14 comprising, according to some possible embodiments, one or more electrically connected transducing elements. The strain gauge sensor 14 comprises at least one transducing element formed on a first side 11a of a deformable substrate 11, and at least one other transducing element formed on a second side 11b of the deformable substrate 11. The transducing elements formed on the first 11a and second 11b sides of the substrate 11 can be electrically connected by electrically conducting lines (not shown in FIG. 1A) formed on and/or in (by vias) the deformable substrate 11. While the transducing elements formed on the surfaces of the substrate 11 can be of any suitable type, including capacitive, resistive, piezoresistive, piezoelectrical, and/or inductive elements, or any combination thereof, the embodiments illustrated in the following figures relates in a non-limiting manner to implementations based on piezoresistive transduction elements.

Figure 1B:
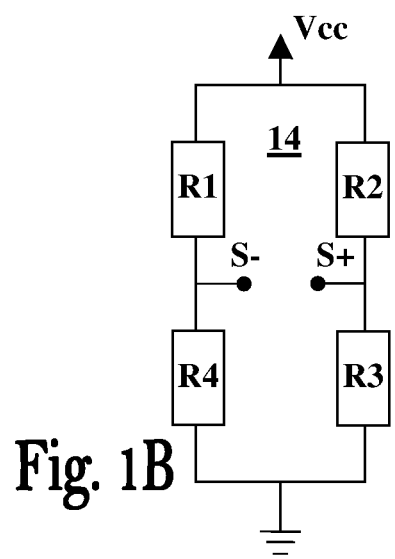

In some embodiments the transducing elements formed on the substrate surfaces are electrically connected to form on the side surfaces of the substrate 11 a differential measurement circuitry configured to accurately measure differences of at least one electrical/physical property thereof (e.g., resistance, inductance, capacitance, voltage and/or current). FIG. 1B exemplifies electrical connection of four transducing elements, R1 R2 R3 and R4, to form a Wheatstone bridge by electrically connecting serially connected pairs of the transducing elements in parallel. In this specific and non-limiting example a first pair of elements is assembled by serial connection of transducing elements R1 and R4, a second pair of elements is assembled by serial connection of transducing elements R2 and R3, and these two serial branches are electrically connected to each other in parallel. In operation an electrical voltage Vcc is applied over the branches of the Wheatstone bridge, which is typically balanced such that the voltage difference measured between the terminals S+ and S− in between each pair of transducing elements is zero in relaxed (non-strained) state of the sensor.

FIG. 1A shows a configuration of the strain gauge sensor 14 wherein the transducing elements of each pair/serial branch of elements of the Wheatstone bridge are formed on different side surfaces of the substrate 11. Particularly, in this non-limiting example transducing elements of the first serially connected pair/branch are established by element R1 formed on the top side 11a of the substrate 11, and element R4 formed on the bottom side 11b of the substrate 11, and the transducing elements of the second serially connected pair/branch are established by element R3 formed on the top side 11a of the substrate 11, and element R2 formed on the bottom side 11b of the substrate 11.

As also shown in FIG. 1A, the substrate 11 is attached on a surface of an object 12 having an opening 12p, such that a portion 11p of the substrate 11 comprising the strain gauge sensor 14 is placed over the opening 12p such that it can be deformed responsive to pressure forces 17 applied thereover. In some embodiments the transduction elements, R1 R2 R3 and R4, are implemented by a type of a piezoresistive pattern formed on the top and bottom surfaces of the deformable substrate 11. In this case, the resistances of the transduction elements, R1 R2 R3 and R4, are changed responsive to the direction of the applied pressure force 17.

In a specific and non-limiting example, wherein the transduction elements, R1 R2 R3 and R4, are resistive elements, and the forces 17 applied over the substrate are directed upwardly, the sensing elements affected as follows:

R1 and R3 act as extension gauges since the upward deformation of the substrate 11 results in elongation of their conductors such that their electrical resistances are proportionally increased due to the applied forces 17; and R2 and R4 act as compression gauges since the upward deformation of the substrate 11 results in shortening of their conductors such that their electrical resistances are proportionally decreased.

Figure 2A:
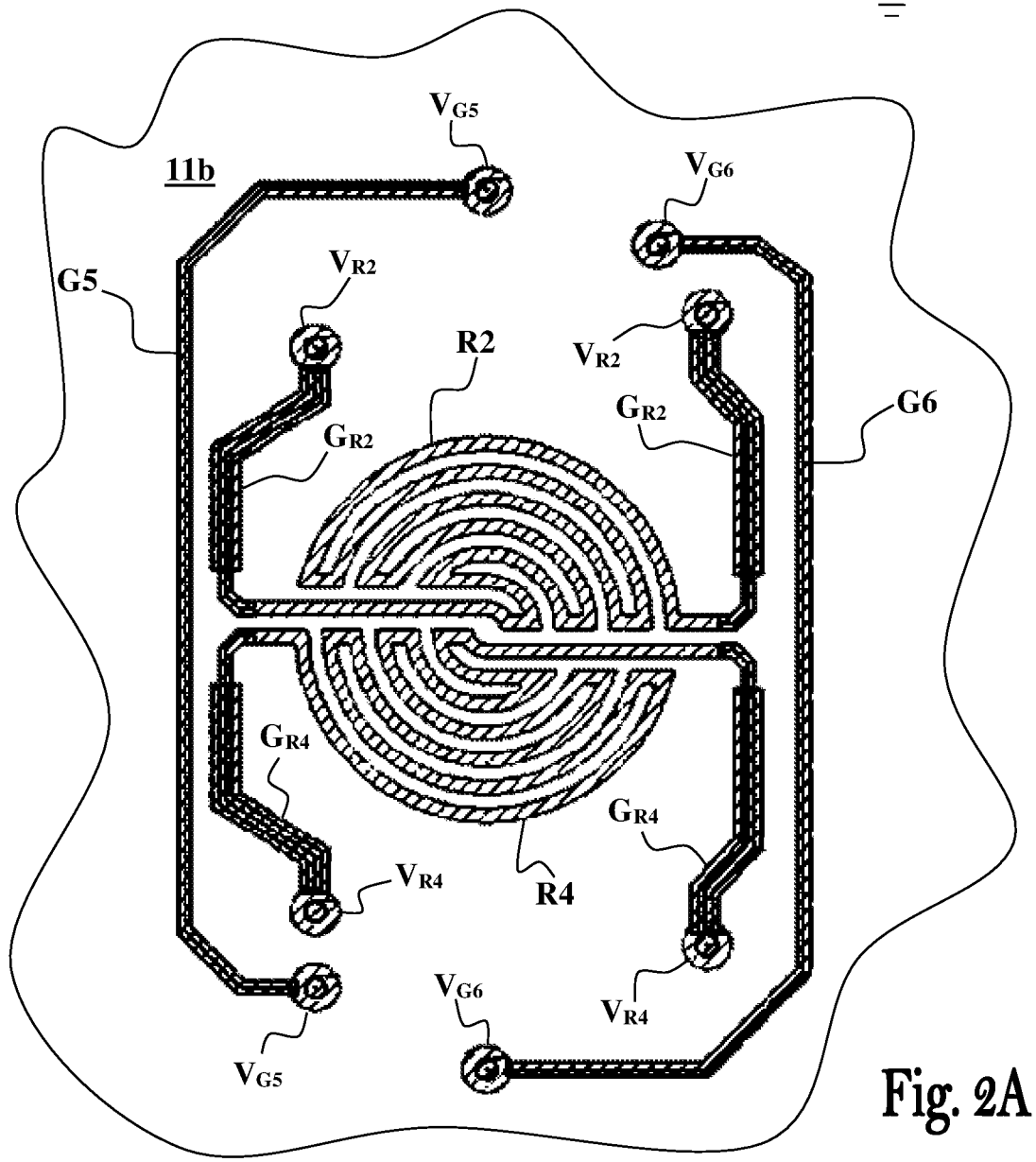
Figure 2B:
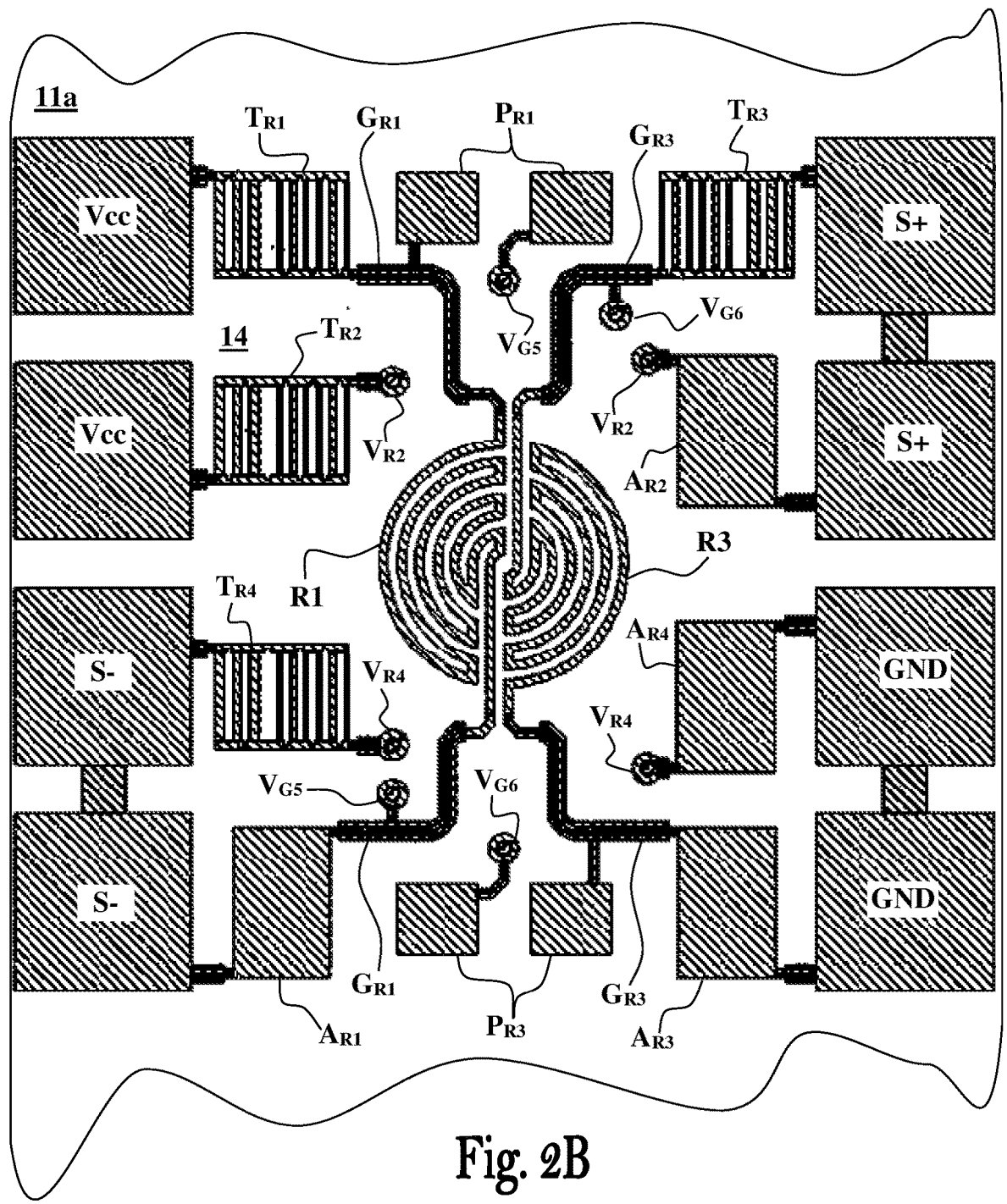
Figure 2C:
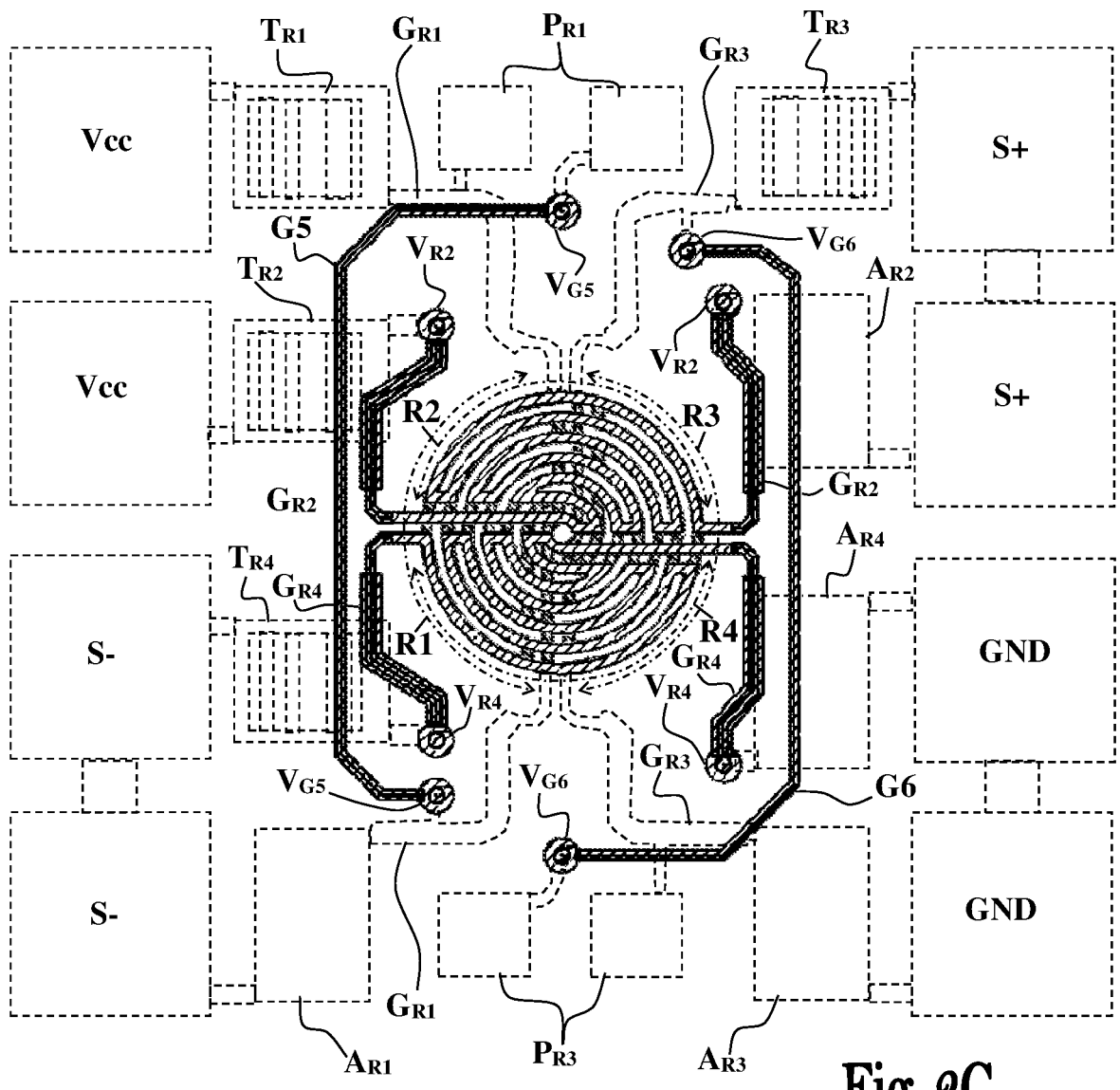

FIGS. 2A to 2C show a possible embodiment of the strain gauge sensor 14 according to some possible embodiments. FIG. 2A shows elements formed on the bottom side 11b of the substrate 11 comprising the two resistive transducers R2 and R4 and their respective conducting lines $G_{R2}$ and $G_{R4}$, and two auxiliary conductors G5 and G6. In this specific and non-limiting example the resistive transducers R2 and R4 are implemented in a form of semi-circular rosette patterns, the end terminals of each one, is electrically connected to two respective conducting lines, $G_{R2}$ and $G_{R4}$, that are electrically connected to elements formed on the top side 11a of the substrates 11 by their respective vias, $V_{R2}$ and $V_{R4}$. Similarly, the auxiliary conductors G5 and G6 are electrically connected to elements formed on the top side 11a of the substrates 11 by respective vias, $V_{G5}$ and $V_{G6}$. As seen, there are two vias $V_{G5}$, each at a respective end of the conducting line G5, and two vias $V_{G6}$, each at a respective end of the conducting line G6.

The semi-circular conducting lines of the resistive transducers R2 and R4 are arranged to substantially fill a circular area by formation of two half-circle patterns, each comprised of half-circle/arc-shaped conducting lines alternatingly interfolded one into the other. The half circle resistive transducers R2 and R4 are arranged one beside the other in a complementary fashion forming together a full circular pattern for maximizing surface area utilization of the substrate.

The two conductors of each transducer element, $G_{R2}$ and $G_{R4}$, generally extend vertically one parallel to the other along the sides of their respective transducer element, where the two conductors $G_{R2}$ generally extends one parallel to the other in a direction opposite to the direction of the generally parallel conductors $G_{R4}$, thereby forming a "H"-like shape having the circular pattern of the transducer elements between the vertically extending conductors. Substantial lengths of the auxiliary conductors G5 and G6 extends substantially in parallel along the sides of the "H"-like shape formed by the resistive transducers R2 and R4 and their respective conductors $G_{R2}$ and $G_{R4}$.

Optionally, and in some embodiments preferably, the electrically conducting lines $G_{R2}$ and $G_{R4}$, electrically connected to the strain gauges R2 and R4 respectively, are substantially symmetrical and have substantially the same lengths and widths, in order to obtain the same electrical resistances, and to minimize as much as possible resistance variations. However, since resistance variations inevitably occur due to imperfections of the fabrication process, their effects will be eliminated/minimized to negligible levels by proper calibration of the differential measurement circuitry of the sensor.

FIG. 2B shows elements formed on the top side 11a of the substrate 11, comprising the two resistive transducers R1 and R3 and their respective conducting lines $G_{R1}$ and $G_{R3}$, a respective fine (analog) trimming/calibration element, $A_{R1}$ $A_{R2}$ $A_{R3}$ and $A_{R4}$, for each of the resistive transducer elements of the sensor, a respective coarse (digital) trimming/calibration element, $T_{R1}$ $T_{R2}$ $T_{R3}$ and $T_{R4}$, for each of the resistive transducer elements of the sensor, and various contact pads for providing electrical connectivity for electrical power supply and for taking measurements. As shown in FIG. 2B, in some possible embodiments the coarse tuning trimming/calibration elements $T_{Ri}$ (where 1≤i≤4 is a positive integer) are ladder shaped elements, however, other possible shapes can be similarly used, that permit discrete length increments of the conductive path, such as exemplified in FIG. 2D. As shown in FIG. 2B, in some possible embodiments the fine tuning trimming/calibration elements $A_{Ri}$ (where 1≤i≤4 is a positive integer) are rectangular elements, however, other possible shapes can be similarly used (e.g., square, circular, oval, triangular, etc.).

The resistive transducer elements R1 and R3 and their respective conducting lines $G_{R1}$ and $G_{R3}$ are formed in a manner similar to the resistive transducer elements R2 and R4 described hereinabove. Namely, the conducting lines of the resistive transducer elements R1 and R3 are half circle arcs alternatingly interfolded one into the other, and the transducer elements R1 and R3 are arranged in a complementary manner to form together a full circle shape for maximizing surface area utilization. The conducting lines $G_{R1}$ and $G_{R3}$ horizontally extend in opposite directions, thereby forming together with the resistive transducer elements R1 and R3 a 90 degrees rotated "H"-like shape having the circular pattern of the transducer elements between the horizontally extending conductors, and they are substantially symmetrical and have substantially the same lengths and widths, in order to obtain the same electrical resistances so as to minimize as much as possible resistance variations.

The conducting lines $G_{R1}$ and $G_{R3}$ at one side of the transducer elements R1 and R3 are electrically connected to respective coarse tuning trimming/calibration elements $T_{R1}$ and $T_{R3}$ of the resistive transducer elements R1 and R3, and the conducting lines $G_{R1}$ and $G_{R3}$ at the other side of the transducer elements R1 and R3 are electrically connected to respective fine tuning trimming/calibration elements $A_{R1}$ and $A_{R3}$ of the resistive transducer elements R1 and R3. The coarse tuning trimming/calibration element $T_{R1}$ electrically connects a first conducting line $G_{R1}$ to the a Vcc voltage supply contact pad, the coarse tuning trimming/calibration element $T_{R3}$ electrically connects a first conducting line $G_{R3}$ to a first S+ terminal pad, the fine tuning trimming/calibration element $A_{R1}$ electrically connects a second conducting line $G_{R1}$ to a first S− terminal pad, and the fine tuning trimming/calibration element $A_{R3}$ electrically connects a second conducting line $G_{R3}$ to a first ground terminal pad GND.

A second S+ terminal pad is electrically connected between the first S+ terminal pad and the fine tuning trimming/calibration element $A_{R2}$, that is electrically connected to the resistive transducer R2 formed on the bottom side 11b of the substrate 11 by a first via $V_{R2}$. Similarly, a second ground terminal pad GND is electrically connected between the first ground terminal pad GND and the fine tuning trimming/calibration element $A_{R4}$, that is electrically connected to the resistive transducer R4 formed on the bottom side 11b of the substrate 11 by a first via $V_{R4}$. A second Vcc terminal pad is electrically connected to the coarse tuning trimming/calibration element $T_{R2}$, that is electrically connected to the resistive transducer R2 formed on the bottom side 11b of the substrate 11 by a second via $V_{R2}$. A second S− terminal pad is electrically connected between the first S− terminal pad and the coarse tuning trimming/calibration element $T_{R4}$, that is electrically connected to the resistive transducer R4 formed on the bottom side 11b of the substrate 11 by a second via $V_{R4}$.

The top side 11a of the sensor 14 optionally further comprises two contact pads $P_{R1}$ for connecting a resistor in parallel to R1, and two contact pads $P_{R3}$ for connecting a resistor in parallel to R3 (e.g., using surface mounting technology—SMT). The parallel electrical connection to R1 is achieved by electrical connection of a first contact pad $P_{R1}$ to the first conducting line $G_{R1}$, and by electrical connection of a second contact pad $P_{R1}$ to the auxiliary conductor G5 by a first via $V_{G5}$ so as to electrically connect the second contact pad $P_{R1}$ to the second conducting line $G_{R1}$ of R1. Similarly, the parallel electrical connection to R3 is achieved by electrical connection of a first contact pad $P_{R3}$ to the second conducting line $G_{R3}$, and by electrical connection of a second contact pad $P_{R3}$ to the auxiliary conductor G6 by a second via $V_{G6}$ so as to electrically connect the second contact pad $P_{R3}$ to the first conducting line $G_{R3}$ of R3.

The contact pads Vcc GND S+ and S− are arranged in two parallel columns at lateral sides of the top side 11a of the substrate 11, the various coarse and fine tuning trimming/calibration elements (collectively referred to herein as trimming elements) are arranged in two parallel internal columns, each extending alongside one of the columns of contact pads, and the 90 degrees rotated "H"-like shape of the resistive transducers R1 and R3 and their respective conducting lines $G_{R1}$ and $G_{R3}$ are arranged in between the two parallel columns of the coarse and fine tuning trimming/calibration elements. Each pair of the optional contact pads $P_{R1}$ and $P_{R3}$ is located at a respective longitudinal side of the 90 degrees rotated "H"-like shape of the resistive transducers R1 and R3 at the center of the columnar structure. As shown in FIG. 2C, the circular arrangements of the resistive transducers pairs (R2, R4) and (R1, R3) are substantially overlapping on the top and bottom sides of the substrate, and 90 degrees rotated one relative to the other. Thus, in this specific and non-limiting example the resistive transducer R1 partially overlaps first portions of the R2 and R4 resistive transducers, and the resistive transducer R3 partially overlaps second portions of the R2 and R4 resistive transducers.

Figure 2D:
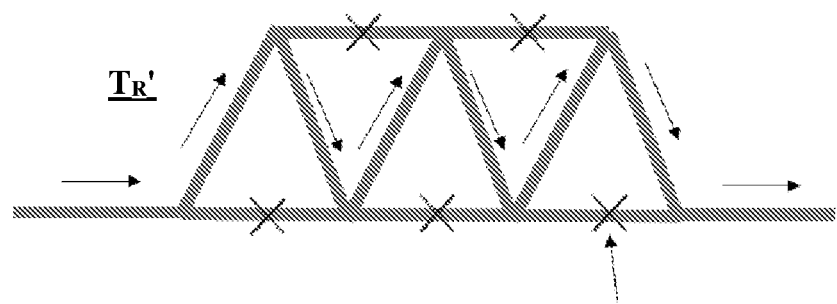

FIG. 2C shows the all the elements formed on the both sides of the substrate 11, wherein the elements formed on the top side 11a are illustrated by dashed lines. FIG. 2D demonstrates an alternative implementation of coarse tuning trimming/calibration element $T_R'$, that can be used to implement any of the coarse tuning trimming/calibration elements $T_{R1}$, $T_{R2}$, $T_{R3}$ and/or $T_{R1}$. As seen, in the trimming/calibration element $T_R'$ the conducting paths are arranged to from triangular structures allowing to adapt the length of the electrically conductive path, and thereby adjust the electrical resistance of the element, by trimming (e.g., laser trimming) the triangular bases marked by 'X'.

Figure 3:
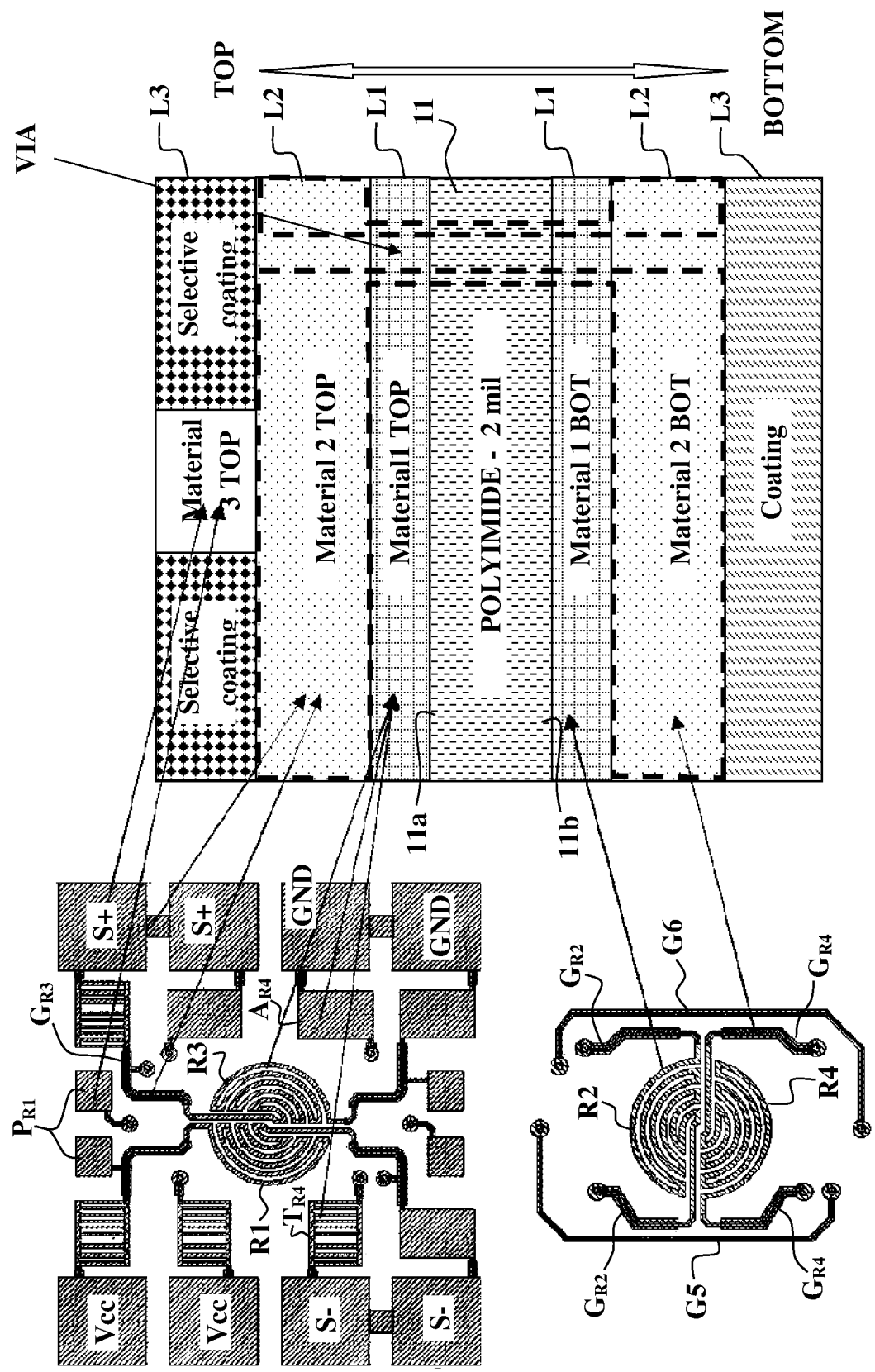
FIG. 3 schematically illustrates a multilayer configuration of a strain gauge sensor according to some possible embodiments.

As shown in FIG. 3, in some embodiments the sensor elements are fabricated from different materials/alloys of different thicknesses. For example, and without being limiting, the resistive transducing elements (interfold arcs), R1 R2 R3 and R4, can be formed by a first layer L1 made of any suitable piezoresistive material/alloy (Material 1 TOP and Material 1 BOT e.g., NiCr, constantan alloy, Karma alloy, etc.) applied over the top and bottom side faces of the substrate 11, in a thickness of about 5 nm to 1000 nm. The trimming elements can be fabricated from the same material/alloy of the resistive transducers (i.e., Material 1 TOP and Material 1 BOT of layer L1) to facilitate the trimming process.

The next top and bottom layers L2 (Material 2 TOP and Material 2 BOT) are respectively applied over the top and bottom L1 layers for forming electrically conducting lines/paths of the sensor, and thus it is made of materials having good electrical conductivity (e.g., copper) in a thickness of about 0.1 µm to 50 µm, for electrically connecting the different parts of the sensing elements and of the trimming grids.

The top layer L3, comprises the material 3 TOP, which is used to form the contact pads (S+ S− GND VCC) of the sensor, and a protective coating covering areas of the L3 layer not including the material 3 TOP. Material 3 TOP is a thin protective layer made from an electrically conducting material configured to prevent oxidation and deterioration of the layer 2 material, and the selective coating regions are made from a protective electrically non-conducting material that coat all the area where material 3 TOP is not present.

The electrically conducting Material 3 TOP of layer L3 has two essential functions: (i) to protect the electrically conducting material layer 2 circuitries; and (ii) to provide a solderable surface when assembling (soldering) the components to the printed circuit board. Examples of possible materials of the Material 3 TOP finishing coating can be HASL/Lead Free HASL, Immersion Tin, OSP/Entek, Electroless Nickel Immersion Gold (ENIG), Gold—Hard Gold, etc. The electrically non-conducting selective coating protects the circuitry/sensing elements, that are not protected by the Material 3 TOP regions.

Figure 4:
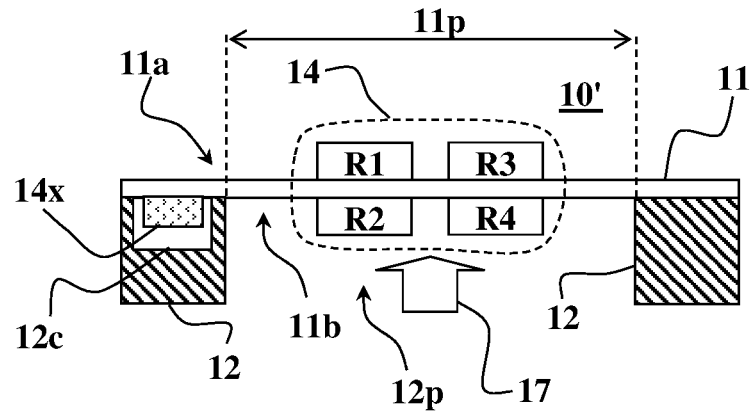
FIG. 4 schematically illustrates a strain gauge sensor comprising additional bottom side circuitries according to some possible embodiments.

The Material 3 TOP is selectively applied on the L2 top layer and it is used to form the contact pads configured to provide the sensor connectivity with the external devices and/or to provide solderable surfaces therefore. Since usually the bottom L3 layer is attached to the object 12, it does not include contact pads e.g., for surface-mount devices (SMD) components i.e., the bottom L3 can form a homogeneous coating. The bottom L3 layer is typically made of materials different from the top L3 layer, such as, but not limited to, polyimide, PEEK, PET, PEN, PC, Teflon or any suitable plastic to improve/facilitate the attaching process to the object 12 or to protect the sensor to specific environmental condition As exemplified in strain measurement setup 10' of FIG. 4, in some possible embodiments the bottom L3 layer is configured to form contact pads on the bottom side of the sensor for electrically connecting (e.g., by SMD) electric/electronic circuitries/components 14x. In this case the object 12 to which the sensor is attached can be configured to include a corresponding cavity (hole, pass-through hole, lumen, or suchlike) 12c (seen in FIG. 4) configured to accommodate the circuitries/components 14x electrically connected to the sensor, while keeping the deformable substrate 11 straight. The circuitries/components 14x can be electrically connected to the components on the top side 11a of the sensors by respective vias and/or conducting lines extending to the edges of the substrate.

Figure 5A:
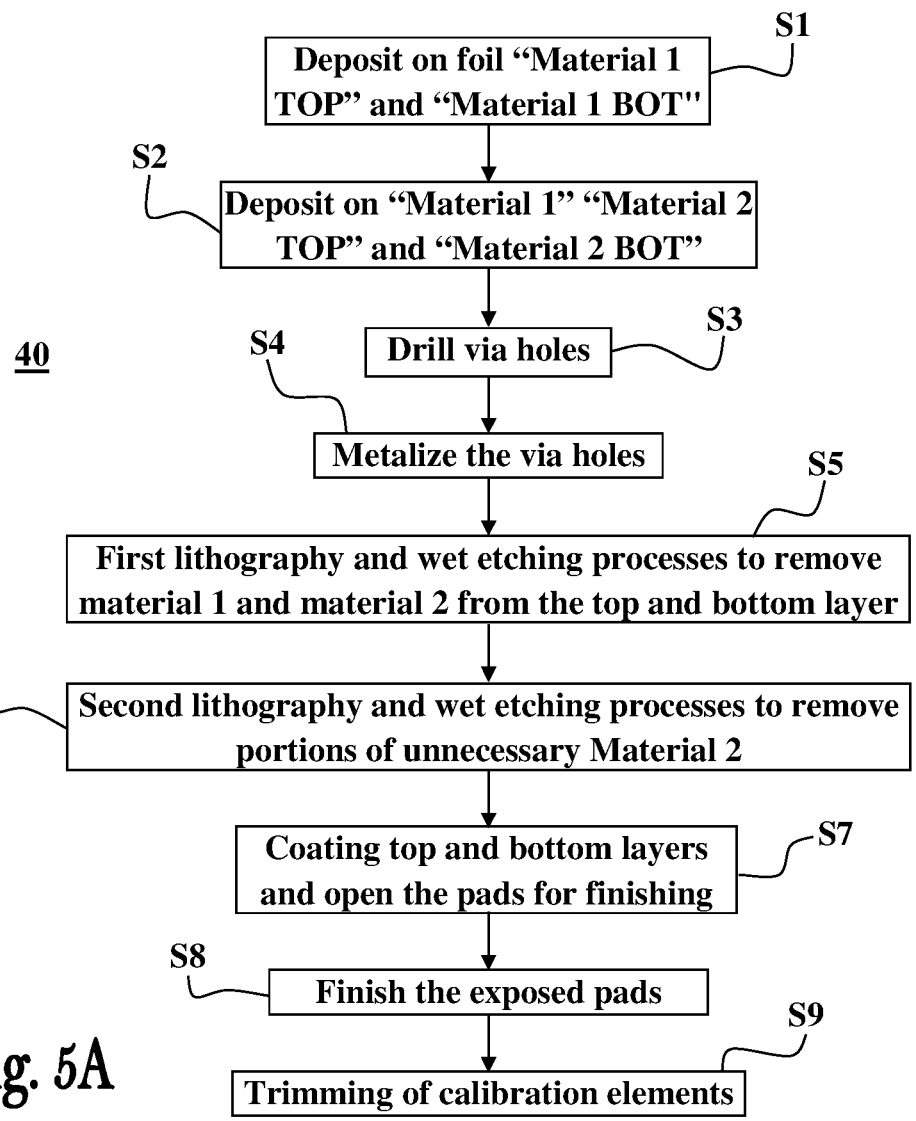

FIG. 5A is a flowchart schematically illustrating a process 40 of fabricating strain gauge sensors according to some possible embodiments. The process 40 starts in step S1 by deposition or laminating on a substrate (foil) the Material 1 TOP and Material 1 BOT layers (L1) of the resistive transducers and their respective trimming elements (e.g., grids). The deposition/lamination of step S1 can be carried out by sputtering, evaporation or lamination. Next, in step S2, the Material 2 TOP and Material 2 BOT layers (L2) used to build the electrically conducting lines and paths are deposited/laminated on the Material 1 TOP and Material 1 BOT layers (L1) deposited/laminated in step S1. The deposition/lamination of step S2 can be carried out by sputtering, evaporation or lamination. In step S3 the via holes are drilled, and in step S4 the via holes are metalized by electroless, or electroplating, or by a combination of electroless and electroplating. The material used to metalize the via holes can be the material used in step S2 for the deposition/lamination of Material 2.

In step S5 first Lithography and wet etching processes are conducted to remove portions of Material 1 and Material 2 from the top and bottom layers, according to the sensor design, over surface areas of the substrate that do not include elements of the sensor, electrically conducting lines, paths and pads. In step S6 second lithography and wet etching processes are conducted to remove only portions of the Material 2 covering surface areas of the Material 1 that do not include Material 2 i.e., without removal of any of the Material 1 depositions underneath (e.g., removing Material 2 from the sensing and trimming/calibration elements). Next, in step S7, top and bottom layers are selectively coated by a protective layer (L3), and surface areas of the contact pads are formed for the finishing in step S8, wherein the exposed contact pads are covered with a suitable solderable/protective materials (e.g., HASL/Lead Free HASL, Immersion Tin, OSP/Entek, Electroless Nickel Immersion Gold (ENIG), Gold—Hard Gold, etc.). The covering process of the exposed pads can be done by immersion and leveling, by electrolytic process, by electroless process or any other suitable process.

In some embodiments the top and bottom L3 layers are formed by coating the entire top and bottom surfaces of the substrate, with their Material 1 and Material 2 patterns, with protective layers made from different materials/compounds, and thereafter using a lithography, or a lithography and lift-off, process to selectively remove portions of the applied protective layer of the layer L3 coating, to thereby form openings in the protective layer of L3 over the Material 1 and/or Material 2 patterns, where the contact pads need to be formed in step S8. Accordingly, layer L3 can comprise protective material portions covering the Material 1 and/or Material 2 patterns, and electrically conductive portions applied in step S8 on the Material 1 and/or Material 2 patterns to form the contact pads.

Finally, in step S9, the sensor circuitry is calibrated by trimming the calibration elements. Step S9 comprises in some embodiments trimming techniques and elements as described in U.S. Provisional No. 62/423,219 of the same applicant hereof, the disclosure of which is incorporated herein by reference.

Figure 5B:
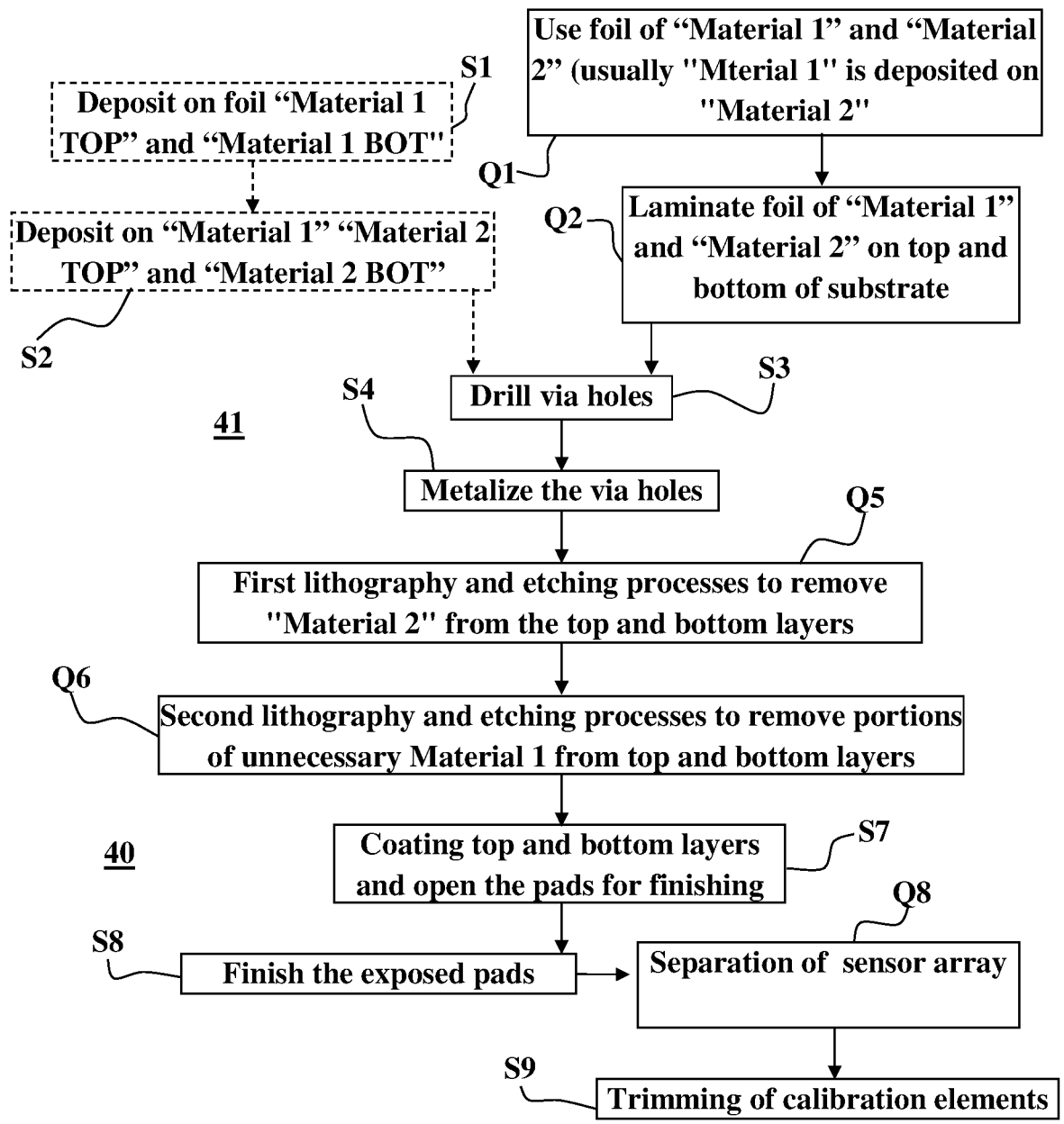
Figure 5C:
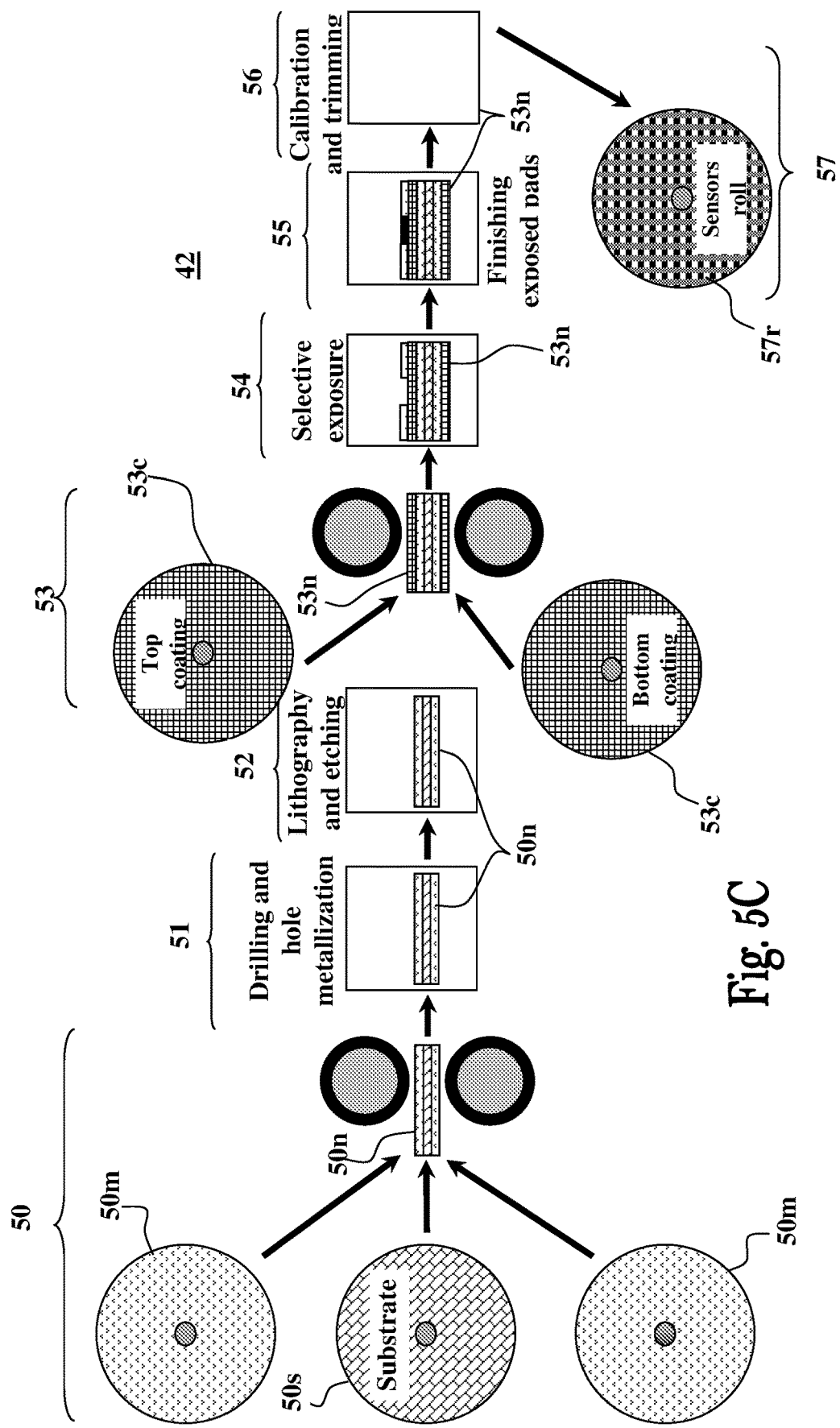
Figure 6A:
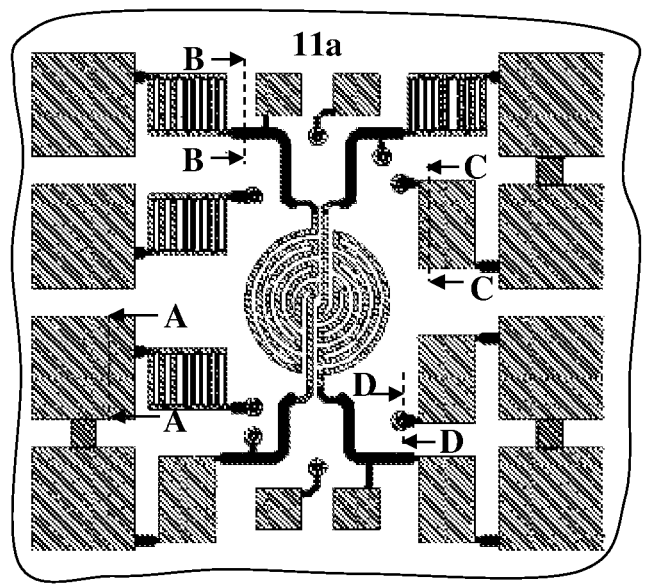
FIGS. 6A to 6E schematically illustrate layered structures obtained at various different surface areas on the top surface of the substrate.
Figure 6B:
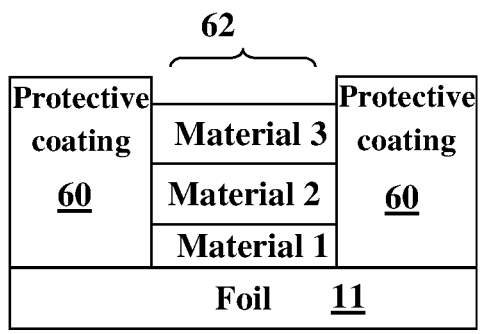

FIGS. 6B to 6E show sectional views of the layered structures on the top side 11a of the substrate 11 formed along line A-A passing across a contact pad, along line B-B passing across a conducting line, along line C-C passing across a fine tuning trimming element, and along line D-D passing across a via, seen in FIG. 6A. As seen in FIG. 6B the layered structures of the contact pads include all three layers (L1 L2 L3). This multilayer structure is obtained by applying the protective electrically conducting Material 3 finishing over the Material 1 and Material 2 patterns, and having the obtained layered structure 62 surrounded by the protective electrically non-conducting coating 60. This structure can be formed by selectively applying the protective coat 60, or by selectively removing portions thereof, to expose the surface areas of the Material 2 patterns, and thereafter applying the Material 3 protective electrically conducting patterns thereover inside the formed openings 62, as described in steps S7 to S9 in FIG. 5.

Figure 6C:
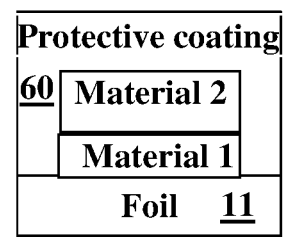
Figure 6D:
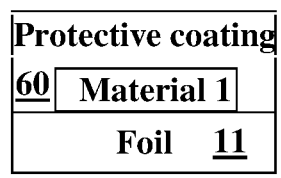
Figure 6E:
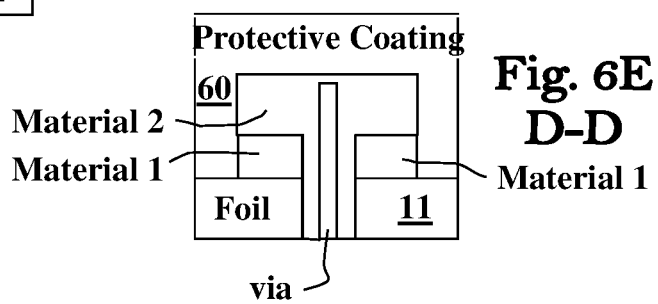

With reference to FIG. 6C, in the layered structures of the conducting lines the electrically non-conducting coating of the third layer (L3) encloses the first two layers (L1 L2) from the top and lateral sides. In FIG. 6D it is seen that in the layered structures of the fine tuning trimming elements the electrically non-conducting coating of the third layer (L3) encloses the first layer (L1) from the top and lateral sides i.e., the material of the second layer L2 is completely removed. The layered structure shown in FIG. 6D is also the structure in the regions comprising the transducing elements. In the sectional layered structures of the via, as seen in FIG. 6E, the electrically non-conducting coating of the third layer (L3) encloses the first two layers (L1 L2) from the top and lateral sides and the internal surfaces of the vias are coated with the material of the second layer (L2).

FIG. 5B is a flowchart schematically illustrating a process 41 of fabricating strain gauge sensors according to some possible embodiments. The process 41 may start by carrying out steps S1 and S2 of FIG. 5A, of depositing the Material 1 TOP and the Material 1 BOTTOM layers on the top and bottom sides of the substrate/film, and depositing the Material 2 TOP on the Material 1 TOP layer, and the Material 2 BOTTOM on the Material 1 BOTTOM layer. Alternatively, but in some embodiments preferably, process 41 starts in step Q1, by providing a foil comprising the Material 1 and Material 2 layers (usually Material 1 is deposited on Material 2, e.g., by sputtering, evaporation, lamination), followed by step Q2, in which the foil of Material 1 and Material 2 is laminated on the top and bottom sides of the substrate/film.

After applying the Material 1 and Material 2 layers, steps S3 and S4 of process 40 are carried out, namely, via holes are drilled through the layer structure obtained, and then metalized using any of the techniques described hereinabove. Thereafter, in step Q5, a first lithography and etching process is carried out to remove portions of the Material 2 layer, and thereby expose regions of the Material 1 layer in which the transducing and trimming/calibration elements are to be formed, and the regions surrounding the conducting lines. In step Q6 a second lithography and etching process is carried out to portions of the Material 1 layer exposed in step Q5, to thereby form the transducing and trimming/calibration elements, and the conductors.

Steps Q5 and Q6 can be performed using different lithography mask and etching material than those used in steps S5 and S6 of FIG. 5A. This production technique can be used to improve the resolution of the sensing lines of the transducing elements (e.g., permitting narrower arc lines and smaller line-space resolution). It is very difficult to achieve this improved resolution with the process 40 of FIG. 5A since it requires to etch though thicker layer (of Material 1 and Material 2). The process 41 requires etching only the thickness of Material 1, and this improve the lines and spaces/gaps resolutions and the repeatability accuracy of the process.

The top and bottom sides of the layered structure are coated in step S7 with an electrically non-conducting protective layer. The protective coating of step S7 can be applied selectively to leave the conducting pads exposed, or it may be applied to cover the entire top and bottom surface areas followed by opening the regions including the pads by selectively removing portions of the protective coating. Next, in step S8, the exposed pads are covered with an electrically conducting protective layer (e.g., gold). If the process 41 is adapted for mass production of the strain gauge sensors (e.g., in wafers), in step Q8 the sensors units are separated. Finally, in step S9, the calibration elements are trimmed for preparing the sensor unit for its intended use.

FIG. 5C schematically illustrates roll-to-roll production process 42 configured for manufacturing the multilayered strain gauge sensors in a continuous uninterrupted line process. The roll-to-roll process 42 starts in the lamination step 50, wherein two continuous sheets, each comprising the Material 1 and Material 2 (M1+M2) layers, pulled/unwind from the rolls 50$m$ and are respectively laminated over two sides of the substrate, which is pulled/unwind from the roll 50$s$. In step 51 the continuous laminated sheet 50$n$ is passed through a drilling and metallization process in which the via holes are formed and filled/coated with an electrically conducting material.

In step 52, the continuous laminated sheet 50$n$ is passed through the lithography and etching process in which portions of the Material 1 and Material 2 layers are removed to form the transducing and calibration/trimming elements and the conducting lines of the sensors. In some embodiments step 52 includes an additional lamination process (not shown) in which a continuous photo-resist sheet is attached to the continuous laminated sheet 50$n$ for carrying out the lithography and etching.

If step 53 the continuous laminated sheet 50$n$ is sandwiched between and laminated to two continuous electrically non-conducting protective sheets pulled/unwind from the rolls 53$c$. The continuous laminated sheet 53$n$ produced in the second lamination of step is passed through a selective exposure process 54 in which portions of the continuous electrically non-conducting protective sheet are removed to expose the connecting pads of the sensors, and in step 55 the electrically conducing protective layer is applied on the opening of the non-conducting protective sheet to finalize preparation of the connecting pads. The finished continuous laminated sheet 53$n$ can be then passed through a calibration process 56, in which the calibration/trimming elements are trimmed to adjust electrical resistances of the sensor elements in each sensor. The process 42 is completed in step 57 by rolling/winding the continuous finalized laminated sheet 53$n$ to the roll 57$r$ of prepared sensor units.

Figure 7A:
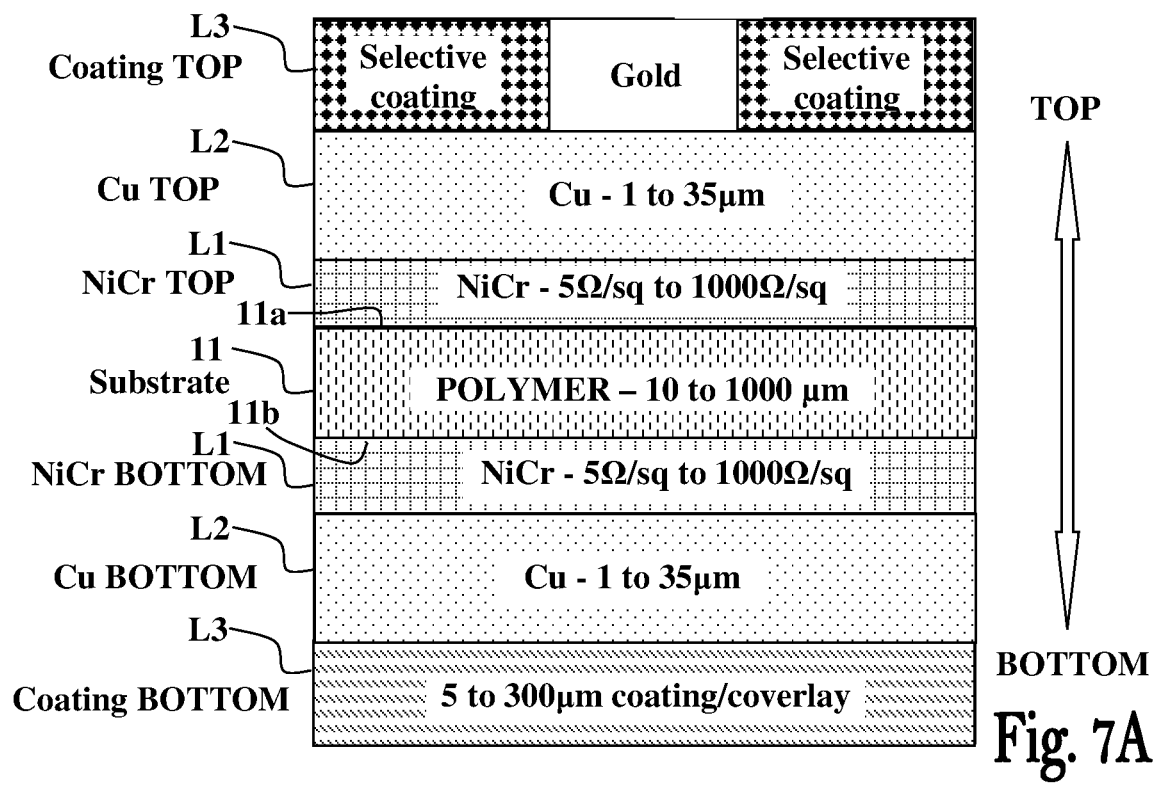
FIGS. 7A and 7B schematically illustrate multilayer configurations of a strain gauge sensor according to some other possible embodiments.

As shown in FIG. 7A the strain gauge sensor can be manufactured by laminating metal layers over a polymeric substrate 11 (e.g., 10 to 1000 micrometers of Polymide PC, Teflon, PET or Peek, foil). In this specific and non-limiting example the first layer L1 is a Nickel-Chromium (NiCr) layer having sheet resistance of about 5 Ohm/sq to 1000 Ohm/sq, laminated over the top and bottom sides of the substrate 11, and the second layers L2 laminated over the top and bottom L1 layers are Copper (Cu) sheet layers having thickness of about 1 μm to 35 μm. The third layers L3 are made of electrically non-conducting protective sheet, which can be laminated over the top and bottom L2 layers.

Optionally, but in some embodiments preferably, the top L3 layer is selectively applied (e.g., using masking techniques) over the top L2 layer to leave areas of the L2 layer to be used as contact pads exposed for coating by an electrically conducting protective layer (e.g., made of Gold). Alternative, in some embodiments the entire top L2 is covered by the L3 layer, and the regions of the L2 layer to be used as contact pads are thereafter exposed for coating by the electrically conducting protective layer.

Figure 7B:
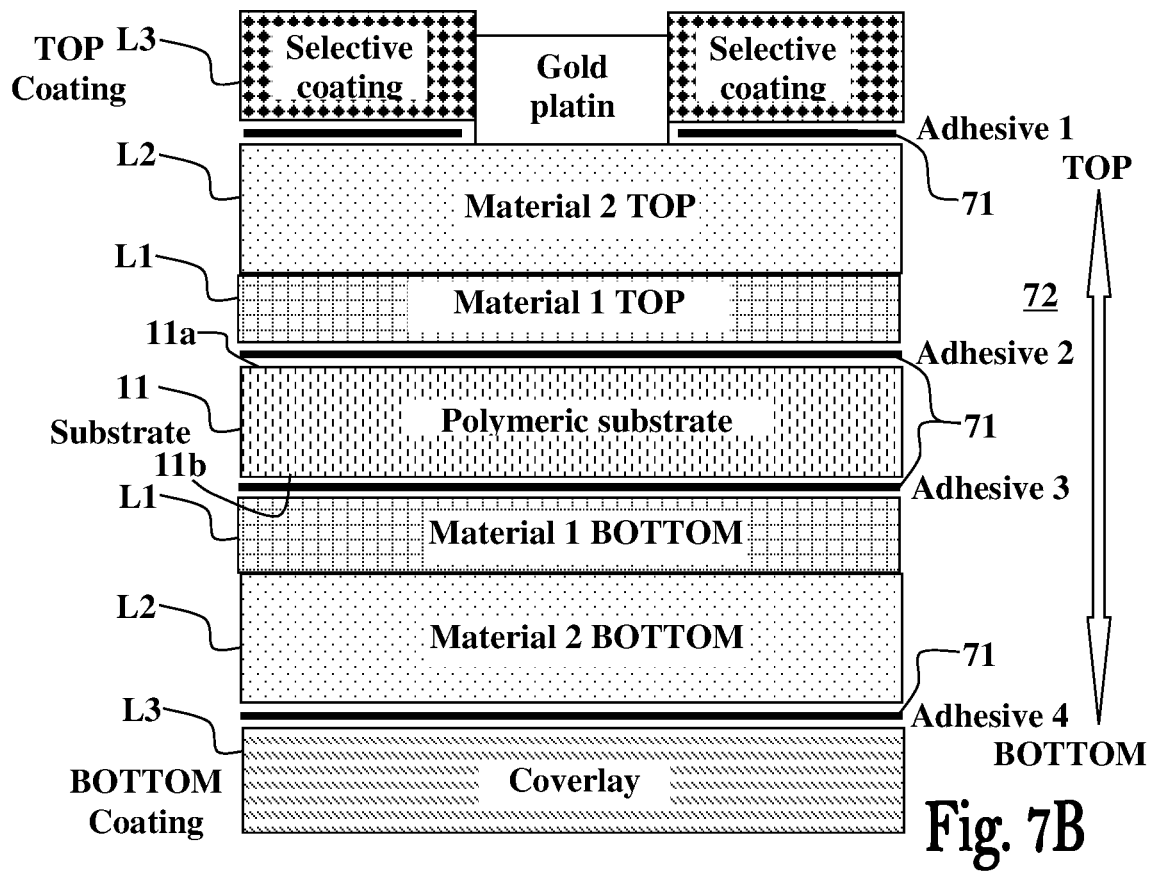

FIG. 7B schematically illustrates a multilayer strain gauge configuration 72 having intermediate layers between the substrate and the L1 layer, and optionally between the L2 and L3 layers. The intermediate layers 71 in FIG. 7B are very thin layers of adhesive (e.g., acrylic, polyurethane, epoxy, and suchlike), or adhesive promoter, configured to connect between the layers. The Adhesive 1 intermediate layer is usually not needed when the selective coating of the TOP L3 layer is applied using a photoimageable polymer, which provides good adhesion to Material 2 of the L2 layer, and to the polymeric substrate. However, if Adhesive 1 intermediate layer is needed, it is either applied selectively (e.g., using masking techniques), or removed from certain regions after it is applied, in order to expose the regions of the L2 layer to be used as contact pads.

Since an adhesive layer can badly effect the performance of the thin L1 layer of Material 1, in some embodiments a type of adhesive promoter is used for the Adhesive 2 and Adhesive 3 layers. The Adhesive 4 intermediate layer is often a thin adhesive layer (the adhesive is typically applied on the coverlay of L3).

It is however noted that some of materials used for the substrate, L1, L2 and L3, layers show good adhesion also without adhesives/promoters. Alternatively, an adhesive-less laminate strain gauge sensor structure can be constructed using a polymeric substrate and the coverlay, that can be laminate together by heat (e.g., by using two thermoset materials with similar melting point). It is noted that the selective coating, and the plating with electrically conductive protective layer (e.g., gold), on top of the L2 layer, can be similarly carried out on the bottom of the L2 layer i.e., the bottom coating (e.g., covelay) is not necessarily a continuous layer.

FIG. 8 shows a possible embodiment wherein the deformable substrate (e.g., thin film/foil) 11' of the sensor is attached over the opening 12p of the object 12' and an extension thereof is used as a flexible printed circuit board (PCB) for mounting additional electric/electronic components 14y on a portion of its bottom side 11b i.e., in the folded portion of the substrate 11' the bottom side 11b becomes upwardly directed. The deformable substrate 11' can be fabricated using any of the techniques described hereinabove and hereinbelow to include the sensor elements 14 and their trimming elements (not shown), and an extension on which further circuitries 14y and/or contact pads can be mounted in electrical connectivity with the other circuitries of the sensor. The measurement setup 10" in FIG. 8 further comprises a cup shaped element 19 mounted on top of the object 12' so as to form a cavity 19c enclosing the portion 11p of the substrate 11' comprising the strain gauge sensor 14.

Optionally, and in some embodiments preferably, the cup shaped element 19 is configured to create a sealed cavity 19c having a predefined pressure level thereinside, as may be needed for implementing an absolute pressure sensor. Alternatively, the cup shaped element 19 can comprises one or more passages (not shown) in its walls for equalizing the pressure conditions inside the cavity 19c to environmental/atmospheric pressure conditions. As seen in FIG. 8, the deformable substrate 11' laterally extends from at least one side of the object 12' and folded over the corresponding side of the cup shaped element 19 and over at least a portion of its top side 19a. Thus, the folded extension of the substrate 11' locates its bottom side 11b accessible from above on top of the cup shaped element 19 i.e., the bottom side 11b of the folded substrates 11' becomes a top side on top of the cup shaped element 19.

The object 12' comprises in this non-limiting example threads 12t formed in its internal wall for sealably attaching it to a fluid vessel/container 18 or conduit, for measuring pressure conditions thereinside by the strain gauge sensor 14, and any of the additional circuitries/elements therefore required can be provided in the additional circuitries 14y of the sensor. It is note that any suitable connecting means can be used instead of, or in addition to, the threads 12t e.g., Luer lock, snap connector, and suchlike.

The deformable substrates 11/11' in the different embodiments disclosed herein can be prepared from any suitable thin film/foil having thickness of about 5 to 1000 microns. For example, the deformable substrates can be fabricated from Polycarbonate, PMMA, Kapton, Polyimide, PEEK, ULTEM, Teflon, PET, PEN or any other thin film polymer. For biocompatible applications the deformable substrates 11/11' can be fabricated from any of the previously mentioned polymers, but in biocompatible grade. In possible embodiments only the bottom cover layer L3 is biocompatible, as its the only part of the sensor device that contacts the fluid materials being examined (as exemplified in FIG. 10). It is noted that the material/compound used for the bottom cover layer L3 is critical to ensure good attachment to plastic body/object carrying the sensor device (e.g., a thermoset that can be laser welded or overmold to the plastic body).

Figure 9:
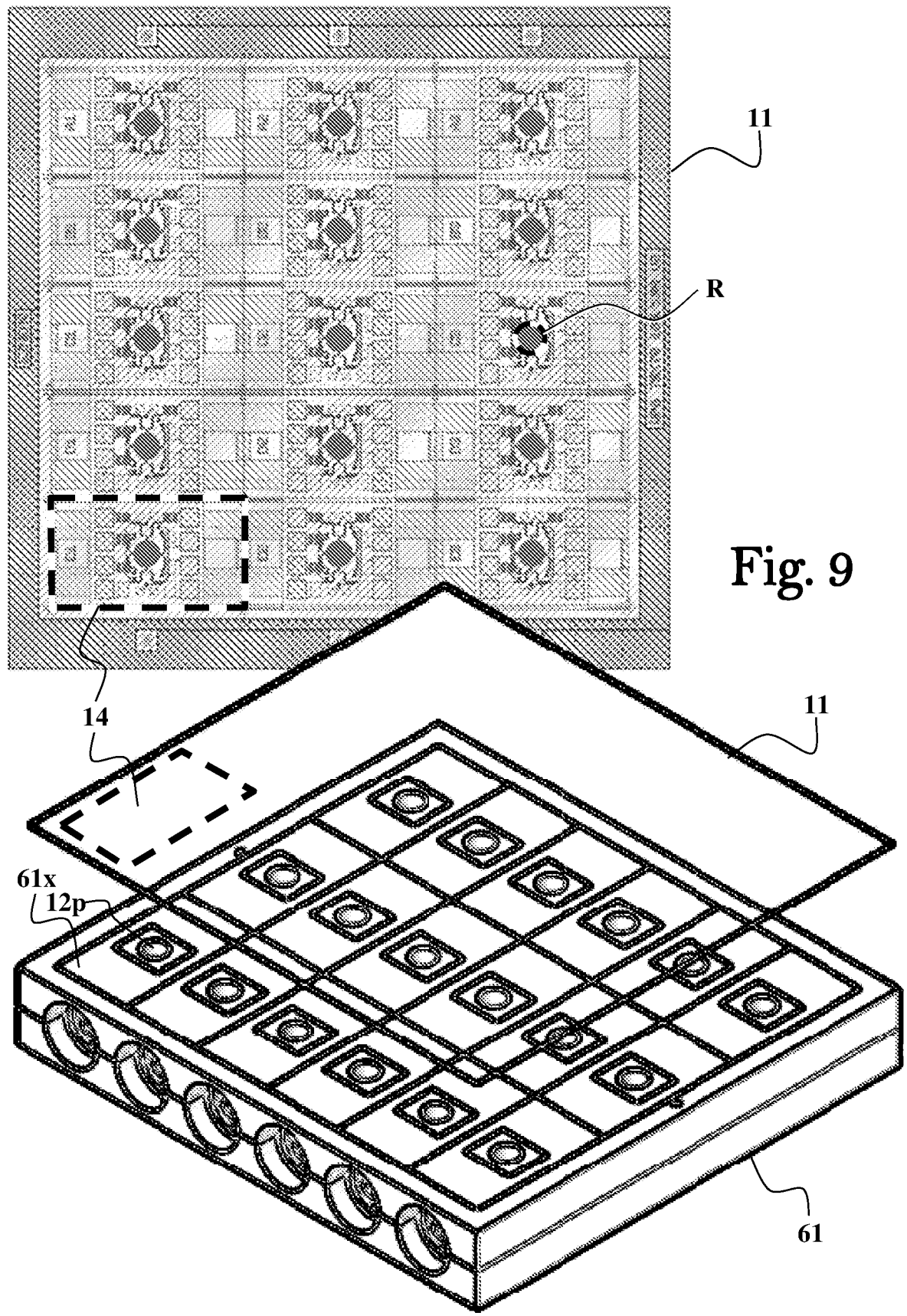
FIG. 9 schematically illustrates production of an array of the sensor elements for attachment to a respective array of MEMS bodies implemented as a wafer.

FIG. 9 schematically illustrates fabrication of an array of sensor elements 14 on a substrate 11 designed to be attached over a corresponding array of MEMS bodies 61x implemented in wafer 61, such as a polymeric wafer described in US Patent Publication No. 2016/0339431, and U.S. Provisional Patent Application No. 62/643,770, both of the same applicant hereof and incorporated herein by reference. Particularly, substrate 11 comprising the array of strain gauge sensors 14 configured for attachment to the wafer 61 over surface areas contacting openings 12p fluidly communicating with internal cavities/lumens and/or passages of the MEMS bodies 61x, to thereby form deformable membranes covering the openings 12p with portions of the substrate 11 comprising the resistive transducers R (i.e., R1 R2 R3 and R4).

In some embodiments the sensor array can be attached to the wafer 61 by one of the following techniques:
  a) The substrate 11 with the array of sensors and their full Wheatstone bridges is sealably attached directly on wafer 61 to seal all of the membranes' openings 12p with the portions of the substrate 11 comprising the resistive transducers R; or
  b) An additional protective foil (not shown) is placed on wafer 61 to seal all of the openings 12p and the substrate 11 with the array of sensors and their full Wheatstone bridges is thereafter attached on the protective foil such that the portions of the substrate 11 comprising the resistive transducers R are placed over the portions of the protective foil covering the openings 12p.

These techniques can be advantageously used to achieve biocompatible implementations since the plastic processes (injection molding, 3D printing and related attachment techniques: gluing, laser welding, hot welding, ultrasonic welding, etc.) used to form the object/MEMS bodies 61x, are separated from the metal deposition processes used to form the strain gauge sensors, the trimming elements, and the conductors, by the foil substrate 11. Thus, the sensor elements R and its full Wheatstone bridge are not required to be biocompatible. The sealing foil needs to have mechanical properties (thickness, modulus Young, etc.) permitting extension and compression gauges.

In some embodiments the array of sensors on the substrate 11 is designed to implement pressure and/or flow sensors (i.e., by incorporating more than one full Wheatstone bridge per chip/MEMS) for polymeric wafer 61. It is noted that the strain gauge sensor designs disclosed herein are suitable for wafer level calibration techniques described in Provisional Patent Application No. 62/643,770 of the same applicant hereof.

Figure 10B:
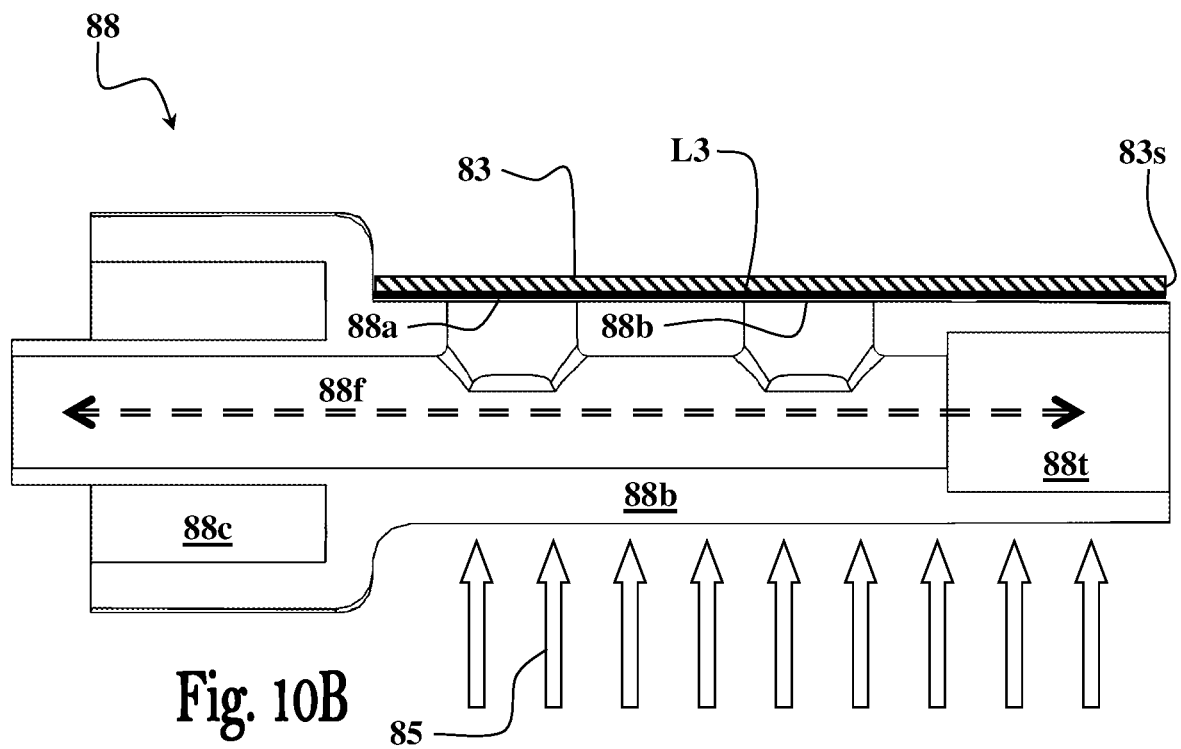
Figure 10C:
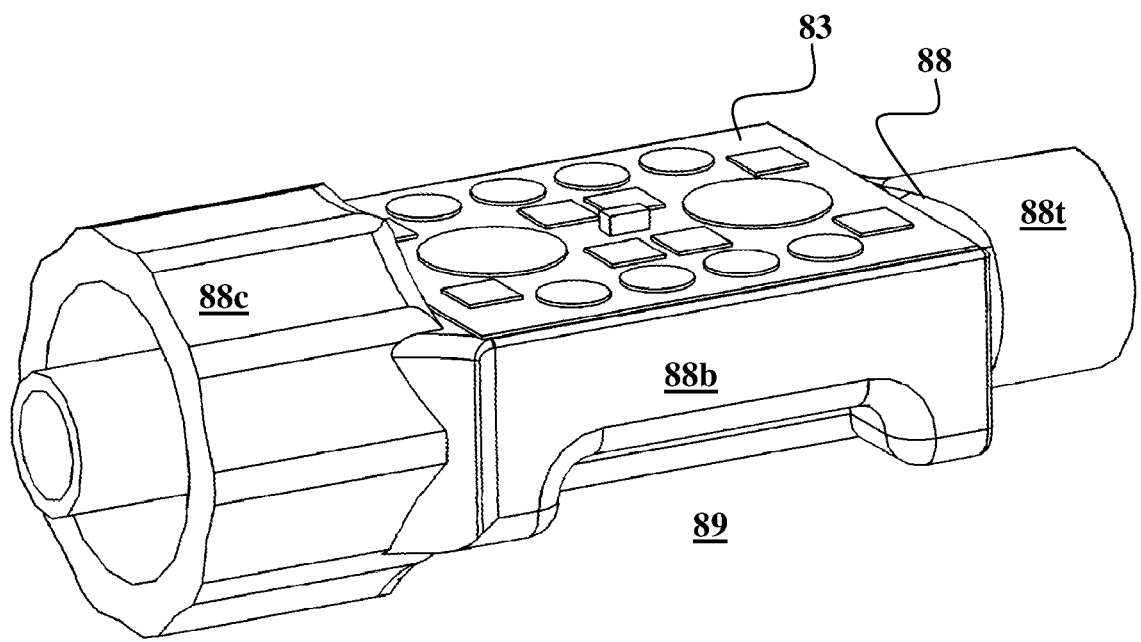

FIGS. 10A to 10C schematically illustrate application of a measuring device 89 utilizing strain gauge sensors according to some possible embodiments. In this non-limiting example discrete sensor arrangements 83s are attached to respective object/body 88. As seen, the sensor arrangement 83s can comprise multiple sensing elements assembled on the substrate/foil 83s with their respective trimming grids 83g. This specific example demonstrates a pressure based flow sensor integrated directly into a fluid passage body having a Luer-lock (a restrictor integrated into the plastic body creates a pressure drops related to the flow). The sensor arrangements 83s can be manufactured as part of an array/continuous layered sheet, using any of the techniques described herein, and then separated into discrete units.

FIG. 10A shows the measuring device 89 before a sensor arrangement 83 is attached to an object/plastic body 88 of the device. The object/body 88 comprises a fluid passage 88f extending along its length, and two openings, 88a and 88b, formed in an upper surface 88r of the object/body 88 in fluid communication with the fluid passage 88f. The object/body 88 can comprise quick connection means, which can be implemented by types of Luer-lock connectors 88c, and/or tube connector 88t. The sensor arrangement 83 can be manufactured on a substrate 83s using any of the techniques described herein. in this non-limiting example, the sensor arrangement 83 comprises two sensing element 83r, one or more trimming elements 83g for calibrating transducing elements of the sensing elements 83r, two or more pads 83p for connecting to each of the sensing elements 83r, and optionally at least one memory usable for storing calibration data and/or other data. Each sensing element 83r can be implemented by a strain gauge sensor 14 having one or more transducing element formed on its top and/or bottom side surfaces, as described and illustrated herein.

As seen in FIG. 10A the sensor arrangement 83 is configured to cover and seal the openings 88a and 88b, such that each one of the sensing elements 83r is placed over a respective opening 88a/88b. This way, after sealingly attaching the sensor arrangement 83 to the upper surface 88r of the object/body 88, portions of the substrate 83s covering the openings 88a and 88b can interact with fluidic substances introduced into the device 89, or flowing through the fluid passage 88f of the device 89, and measure various properties/conditions thereof e.g., pressure, flow rate, humidity, and/or temperature.

The assembly of the sensor device 89 can be carried out using overmolding or welding (e.g., laser welding) techniques, or by gluing. FIG. 10B shows a sectional view of the object/body 88 illustrating attachment of the sensor arrangement 83 to the object/body 88 by laser welding. For laser welding attachment at least a portion of the object/body 88 receiving the sensor arrangement 83 is made transparent (e.g., using a transparent plastic material), such that the laser beams 85 applied from the bottom side of the body/object 88 can at least partially penetrate into object/body 88, or pass through it, to reach the bottom coating/coverlay L3 of the substrate/foil 83s of the sensor arrangement 83. Since the bottom coating/coverlay L3 of the substrate/foil 83s is made of a laser adsorbent material, the heat produced on the laser adsorbent layer L3 welds the substrate/foil 83s and the plastic object/body 88 together.

It is important to properly select the coverlay/coating (bottom) layer L3 to include materials that will guarantee integration in plastic object/body 88. Usually the bottom L3 coverlayer/coating layer is in contact via the openings, 88a and 88b, with the fluid passing through the fluid passage 88f within the body/object 88. Thus, proper selection of the materials of the bottom L3 layer is also important in medical applications to guarantee biocompatibility, and also in ingestible/food related applications, wherein the bottom L3 layer needs to be a food grade layer. FIG. 10C shows the sensor device 89 after the sensor arrangement 83 is attached to the object/body 88.

Figure 11A:
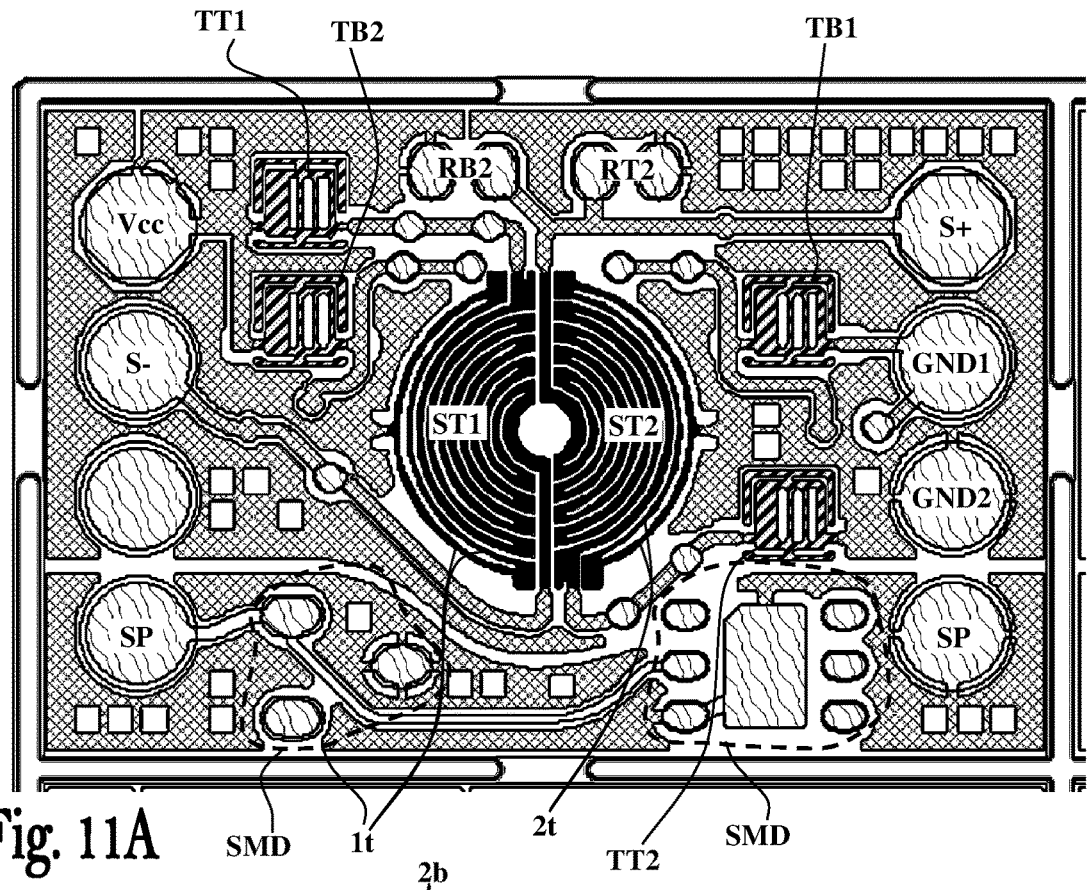
Figure 11B:
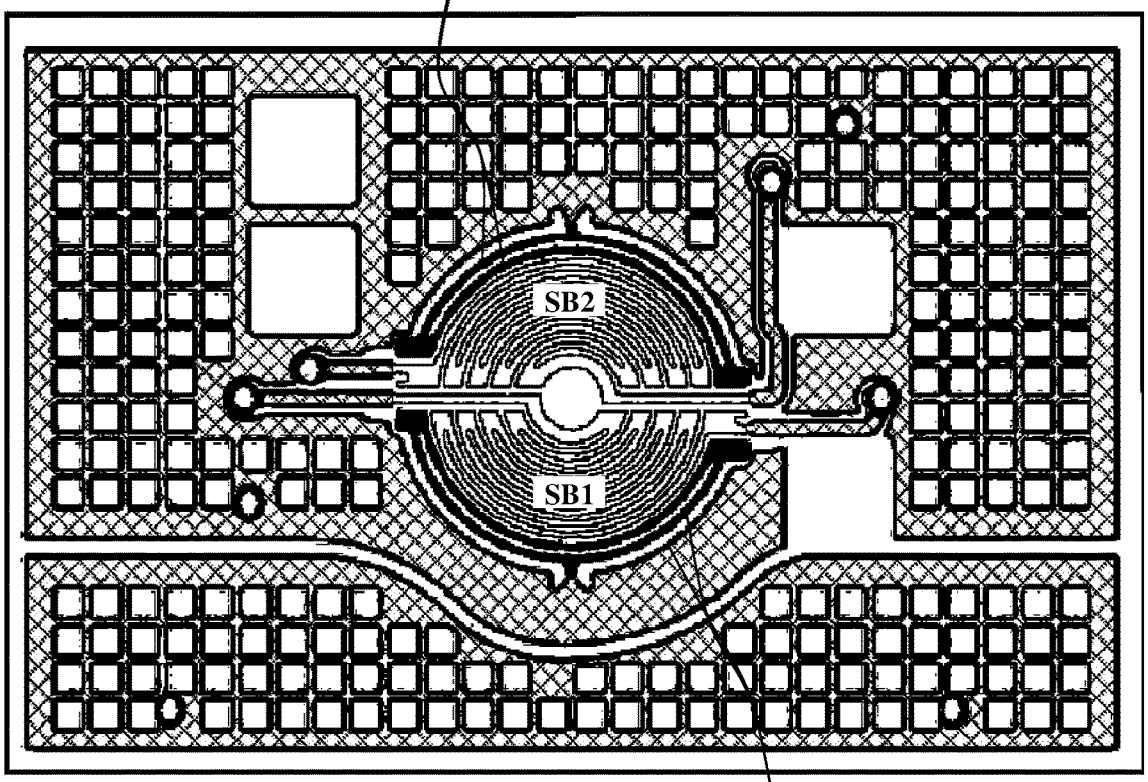
Figure 11C:
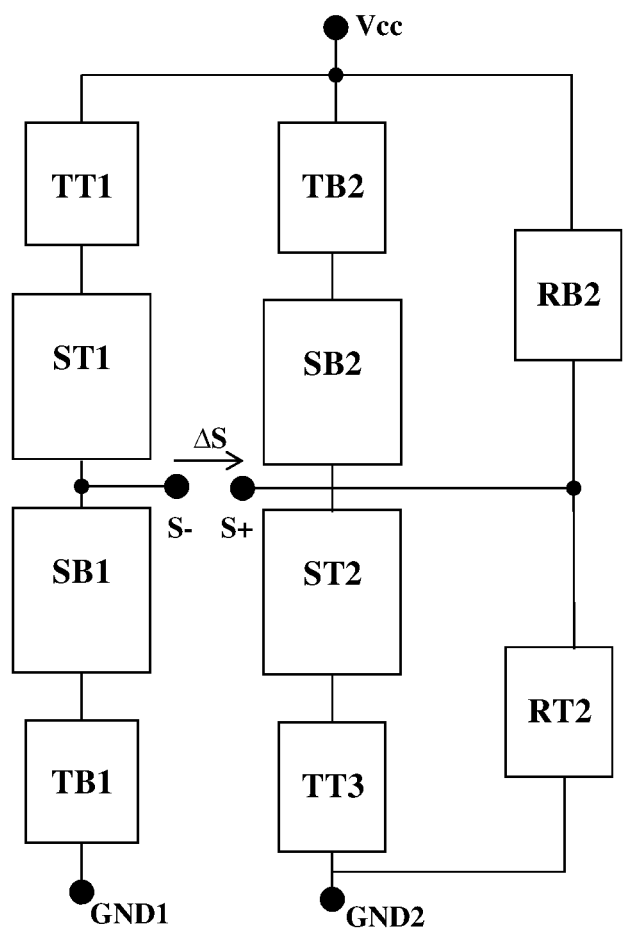

FIGS. 11A to 11B schematically illustrate an implementation of the strain gauge sensor according to some possible embodiments. FIG. 11A shows a top view of the sensor, FIG. 11B shows a bottom view of the sensor, and FIG. 11C shows an electrical diagram of the sensor. In this implementation the transducing elements, ST1, ST2, SB1 and SB2, the outer most arc-shaped elements are grounded dummy lines, such that each transducing element surrounded by at least one grounded dummy line. The grounded dummy line are formed as part of the transducing elements, using the same manufacturing techniques and processes, but they are not electrically connected to the lines of the transducing elements. Particularly, the transducing element ST1 comprises two grounded dummy lines 1t, the transducing element ST2 comprises two grounded dummy lines 2t, the transducing element SB1 comprises two grounded dummy lines 1b, and the transducing element SB2 comprises two grounded dummy lines 2b.

The dummy lines are added to improve the repeatability of the sensing lines production process, and the stability of the transducing elements, and they can be are electrically connected to ground to avoid floating conducting elements and to provide electromagnetic shielding against disturbances. While the internal dummy lines should be as thick as the sensing lines of transducing elements, in some embodiments the outermost (external) dummy lines are made thicker than the sensing lines of transducing elements. The line-space distance/gap between the dummy lines can be the same as the line-space distance/gap between the sensing lines of the transducing elements. Optionally, the dummy line are not connected to the ground.

As also seen in FIGS. 11A and 11B, most of the top and bottom surface area of the sensor are covered by conducting regions/planes electrically connected to the ground or to the input power line (Vcc), to improve the production process and its repeatability, to provide electromagnetic shielding against disturbances and to improve heatsink/heat dissipation. These regions/planes are formed by the layered structure shown in FIG. 6C or FIG. 6D. This sensor implementation can comprise SMD components connected to respective SMD pads. For example, the SMD components can comprise a non-volatile memory used for storing calibration data e.g., retrieved by an external acquisition unit connected to the sensor via the contact the pads.

In addition, the trimming grids in this non-limiting example are necessarily structured as shown in FIG. 6D, as in some embodiments they are not covered by the electrically non-conducting protective layer, because trimming this layered structure can be very difficult. Thus, in some embodiments the trimming grids are not coated by non-conducting protective coat. Instead, they are coated by a removable material layer deposited on these areas, which is configured to be easily removed for carrying out the trimming. After the trimming these areas will can be coated with a protective polymeric layer (not shown). It is also note that the terms such as top and bottom, and similar adjectives used herein in relation to orientation of the elements and components of the strain gauge sensor, and the measurement setups disclosed herein, refer to the manner in which the illustrations are positioned on the paper, not as any limitation to the orientations in which the strain gauge sensor can be used in actual applications. It should also be understood that throughout this disclosure, where a process or method is shown or described, the steps of the method may be performed in any order or simultaneously, unless it is clear from the context that one step depends on another being performed first.

As described hereinabove and shown in the associated figures, the present application provides strain gauge sensor designs, particularly useful for MEMSs, and related methods. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. A sensor device, comprising:
    at least one deformable substrate;
    at least one transducer element formed in or on a surface area of a first side of said at least one deformable substrate;
    at least one other transducer element formed in or on a surface area of a second side of said at least one deformable substrate; and
    electrical conductors formed on and/or in said at least one deformable substrate for electrically connecting between and to said at least one transducer element,
    wherein the at least one deformable substrate is made from two or more electrically conducting layers attached to an electrically non-conducting film, said two or more electrically conducting layers configured to form the at least one transducer elements and the electrical conductors,
    and wherein the two or more electrically conducting layers comprising a first layer made of a piezoresistive material or compound attached to the electrically non-conducting film, and a second layer made of a material or compound having good electrical conduction properties applied over said first layer on regions of the electrically non-conducting film wherein the first layer been removed or not applied.

2. The sensor device of claim 1 wherein the at least one transducing element and the at least one other transducing element and the electrical conductors thereof are configured on an integrated foil.

3. The sensor device of claim 1, further comprising at least one via hole formed in the at least one deformable substrate for electrically connecting between the at least one transducing element and at least one of the electrical conductors formed at different sides of the at least one deformable substrate.

4. The sensor device of claim 1, further comprising at least one protective layer applied over regions of the two or more electrically conducting layers, said at least one protective layer comprising at least one electrically insulating region covering at least the at least one transducing element.

5. The sensor device of claim 4, further comprising circuitries or contact pads formed in or on the at least one deformable substrate and electrically connected to one or more of the electrical conductors, wherein the at least one protective layer comprises at least one electrically conducting region located on top of at least one of said contact pads.

6. The sensor device of claim 1 wherein the first layer made of the piezoresistive material or compound is attached to at least some portion of the layer made of the material or compound having the good electrical conduction properties.

7. The sensor device of claim 1, further comprising at least one calibration element formed in regions of the first layer, wherein the second layer been removed or not applied, said at least one calibration element is electrically connected to the at least one transducer element.

8. The sensor device of claim 1 wherein the first and second electrically conducting layers are applied over first and second sides of the electrically non-conducting film.

9. The sensor device of claim 8 comprising protective layers applied over the two or more electrically conducting layers formed on the top and bottom sides of the electrically non-conducting film.

10. The sensor device of claim 8 comprising protective layers applied over the two or more electrically conducting layers formed on the bottom side of the electrically non-conducting film, at least one of said protective layers is a biocompatible, or food grade, layer configured to contact an examined fluid and isolate said fluid from the electrically conducting layers.

11. The sensor device of claim 8 comprising a protective layer applied over the two or more electrically conducting layers formed on the bottom side of the electrically non-conducting film, said protective layer configured to sealingly attach to an object to which said device is to be attached.

12. The sensor device of claim 11 wherein the protective layer applied over the two or more electrically conducting layers formed on the bottom side of the electrically non-conducting film is made from a material configured to be attached to a plastic object by welding, gluing, extrusion, or overmolding.

13. The sensor device of claim 1 comprising at least two transducer elements formed on the first side of the substrate, and at least two transducer elements formed on the second side of the substrate.

14. A method of fabricating the sensor device of claim 1, the method comprising applying over first and second sides of the electrically non-conducting film a first layer of a material having desired electrical resistance properties, applying on said first layer a second layer of a material having desired electrical conductivity properties, selectively removing portions of said first and second layers on said first and second sides of the electrically non-conducting film to form the transducer elements, and removing portions of the second layer residue on surface areas of said first and second sides of the electrically non-conducting film comprising said transducer elements.

15. The method of claim 14, further comprising selectively removing portions of said first and second layers to form at least one trimming grid on at least one of the first and second sides of the electrically non-conducting film, and selectively removing portions of the second layer residue on surface areas of the electrically non-conducting film comprising said at least one trimming grid.

16. The method of claim 14 comprising drilling at least one via hole in the electrically non-conducting film for electrically connecting between at least one transducer element formed on the first side of the deformable substrate and at least one transducer element formed on the second side of the deformable substrate.

17. The method of claim 14, further comprising selectively applying a protective layer over residues of the first and second layers on the first and second sides of the electrically non-conducting film.

18. The method of claim 17, further comprising forming at least one contact pad in or on the electrically non-conducting film in electrical connection with at least one of the transducing elements, and wherein some portion of the protective layer having a defined electrical conductivity properties is applied over surface areas of the at least one contact pad, and some portion of the protective layer having a defined electrical insulating properties is applied over surface areas of transducing elements and electrical conductors.

19. A sensor device comprising:
  at least one deformable substrate made from an electrically non-conducting film;
  two or more electrically conducting layers attached to said electrically non-conducting film, said two or more electrically conducting layers having: (i) at least one piezoresistive layer selectively attached to said electrically non-conducting film to form at least one transducer element; and (ii) at least one conduction layer selectively attached on top of said electrically non-conducting film and to said at least one piezoresistive layer to form electrical conductors electrically connecting between and to said at least one transducer element; and
  protective layers applied over the two or more electrically conducting layers formed on top and bottom sides of the electrically non-conducting film to form at least one top protective layer selectively applied over regions of the two or more electrically conducting layers wherein at least one of the transducing elements is thereby formed on the top side of the electrically non-conducting film, and at least one bottom protective layer applied over the two or more electrically conducting layers formed on the bottom side of the film, at least one of said bottom protective layer is made from a material configured to be attached to a plastic object by welding, gluing, extrusion, or overmolding.

20. A sensor device, comprising:
  at least one deformable substrate made from an electrically non-conducting film; and
  two or more electrically conducting layers attached to said electrically non-conducting film, said two or more electrically conducting layers having: (i) at least one piezoresistive layer selectively attached to said electrically non-conducting film to form at least one transducer element and at least one calibration element; and (ii) at least one conduction layer selectively attached on top of said electrically non-conducting film and to said at least one piezoresistive layer to form electrical conductors electrically connecting between and to said transducer and calibration elements.

* * * * *